US008796719B2

(12) United States Patent
Ohe et al.

(10) Patent No.: US 8,796,719 B2
(45) Date of Patent: Aug. 5, 2014

(54) LIGHT-EMITTING ELEMENT, DISPLAY AND DISPLAY DEVICE

(75) Inventors: Masahito Ohe, Osaka (JP); Yoshimasa Fujita, Osaka (JP); Yuhki Kobayashi, Osaka (JP); Ken Okamoto, Osaka (JP); Hidenori Ogata, Osaka (JP); Makoto Yamada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 74 days.

(21) Appl. No.: 13/579,874

(22) PCT Filed: Oct. 28, 2010

(86) PCT No.: PCT/JP2010/069174
§ 371 (c)(1),
(2), (4) Date: Aug. 17, 2012

(87) PCT Pub. No.: WO2011/104936
PCT Pub. Date: Sep. 1, 2011

(65) Prior Publication Data
US 2012/0326180 A1    Dec. 27, 2012

(30) Foreign Application Priority Data
Feb. 25, 2010    (JP) .................................. 2010-040886

(51) Int. Cl.
*H01L 33/00*    (2010.01)
*H01L 21/00*    (2006.01)
(52) U.S. Cl.
USPC .............................................. 257/98; 438/30
(58) Field of Classification Search
USPC ..................... 257/13, 79, 98; 313/498–506; 438/29–32
See application file for complete search history.

(56) References Cited

U.S. PATENT DOCUMENTS

| 5,126,214 A | 6/1992 | Tokailin et al. |
| 7,030,555 B2* | 4/2006 | Nakamura et al. ............ 313/504 |
| 8,338,819 B2* | 12/2012 | Lu et al. ......................... 257/13 |
| 2004/0183963 A1* | 9/2004 | Nakamura et al. ............. 349/69 |
| 2004/0212296 A1 | 10/2004 | Nakamura et al. |
| 2007/0114523 A1 | 5/2007 | Oumi et al. |

(Continued)

FOREIGN PATENT DOCUMENTS

| JP | 3-152897 A | 6/1991 |
| JP | 5-255860 A | 10/1993 |

(Continued)

OTHER PUBLICATIONS

International Search Report received for PCT Patent Application No. PCT/JP2010/069174, mailed on Feb. 8, 2011, 5 pages (2 pages of English Translation and 3 pages of PCT Search Report).

(Continued)

*Primary Examiner* — Calvin Lee
(74) *Attorney, Agent, or Firm* — Morrison & Foerster LLP

(57) ABSTRACT

A light-emitting element of the present invention includes (i) a light-emitting layer (109), (ii) an electrode layer (110) being transparent to part of light emitted from the light-emitting layer (109), (iii) color converting layers (113, 114), and (iv) a transparent layer (115). The color converting layers (113, 114) and the transparent layer (115) sandwich the transparent electrode layer (110) with the light-emitting layer (109). The color converting layers (113, 114) and the transparent electrode layer (115) contain particles (116, 117, 118) expressing a surface plasmon phenomenon, respectively.

20 Claims, 5 Drawing Sheets

(56) References Cited

U.S. PATENT DOCUMENTS

| | | |
|---|---|---|
| 2007/0164661 A1 | 7/2007 | Kuma |
| 2007/0181889 A1* | 8/2007 | Orita .............................. 257/79 |
| 2008/0029710 A1 | 2/2008 | Sekiya et al. |
| 2009/0224654 A1 | 9/2009 | Boerner |

FOREIGN PATENT DOCUMENTS

| | | |
|---|---|---|
| JP | 2004-207136 A | 7/2004 |
| JP | 2004-311153 A | 11/2004 |
| JP | 2007-139540 A | 6/2007 |
| JP | 2007-165284 A | 6/2007 |
| JP | 2007-207578 A | 8/2007 |
| JP | 2008-523545 A | 7/2008 |
| WO | 2005/097939 A1 | 10/2005 |
| WO | 2008/015807 A1 | 2/2008 |

OTHER PUBLICATIONS

Mach et al., "Physics and Technology of Thin Film Electroluminescent Displays", Semicond. Sci. Technol., vol. 6, 1991, pp. 305-323.

* cited by examiner

LIGHT-EMITTING ELEMENT, DISPLAY AND DISPLAY DEVICE

CROSS REFERENCE TO RELATED APPLICATIONS

This is a U.S. National Phase patent application of PCT/JP2010/069174, filed Oct. 28, 2010, which claims priority to Japanese Patent Application No. 2010-040886, filed Feb. 25, 2010, each of which is hereby incorporated by reference in the present disclosure in its entirety.

TECHNICAL FIELD

The present invention relates to (i) a light-emitting element such as an organic electroluminescence (hereinafter referred to as "organic EL") element, (ii) a display and (iii) a display device.

BACKGROUND ART

Generally, electroluminescence elements are self-luminous, and therefore excellent in visibility. Further, they are perfect solid elements, and therefore have an excellent impact resistance and are easily treatable. Hence, the electroluminescence elements have been expected to be employed as light-emitting elements in various display devices. The electroluminescence elements are classified into (i) inorganic EL elements in which a light-emitting material is an inorganic compound and (ii) organic EL elements in which a light-emitting material is an organic compound. Among these, the organic EL elements can remarkably reduce a voltage to be applied thereto, and therefore have been eagerly studied for practical use.

An organic EL element basically includes an anode, a light emitter layer, and a cathode. The organic EL element can include a hole injecting/transporting layer, and an electron injecting/transporting layer as appropriate. There have been known, for example, (i) an organic EL element including an anode, a hole injecting/transporting layer, a light emitter layer, and a cathode, and (ii) an organic EL element including an anode, a hole injecting/transporting layer, a light emitter layer, an electron injecting/transporting layer, and a cathode. A hole injecting/transporting layer has a function of transmitting, to a light emitter layer, holes injected from an anode. An electron injecting/transporting layer has a function of transmitting, to a light emitter layer, electrons injected from a cathode. There have been known that (i) plural of holes are injected into the light emitter layer in a weaker electric field by sandwiching the hole injecting/transporting layer between the light emitter layer and the anode, and (ii) electrons injected into the light emitter layer from the cathode or from the electron injecting/transporting layer are accumulated on an interface between the hole injecting/transporting layer and the light emitter layer because the hole injecting/transporting layer does not transport the electrons, whereby an emission efficiency is improved. Examples of how to produce a multi-colored light emitting element of the organic EL element encompass (1) a color converting method (see, for example, Patent Literatures 1 and 2) for converting blue light into multicolored light of green and red by means of fluorescence conversion, (2) a white light color filtering method (see, for example, non-Patent Literature 1) for converting white light into multicolored light of red, green and blue by use of color filters, and (3) a micro resonator method for producing multicolored light of red, green and blue from white light or various colored light by use of a micro resonator.

Patent Literature 3 discloses a configuration where a light scattering layer, in which metal fine particles are dispersed, is provided between an electrode and a light-emitting layer. The configuration makes it possible to scatter and emit outside light from the light-emitting layer by use of the metal fine particles, thereby improving an emission efficiency. A plasmon phenomenon induced by the metal fine particles makes it possible to utilize light confined in the light-emitting layer or layers in the periphery of the light-emitting layer, whereby light is more efficiently utilized (see Patent Literature 3). Patent Literature 4 discloses a configuration in which plate-like metal particles are arranged in an island manner, and fluorescent molecules are borne therebetween.

CITATION LIST

Patent Literature

Patent Literature 1
Japanese Patent Application Publication Tokukaihei No. 3-152897 A (Publication Date: Jun. 28, 1991)
Patent Literature 2
Japanese Patent Application Publication Tokukaihei No. 5-255860 A (Publication Date: Oct. 6, 1993)
Patent Literature 3
Japanese Patent Application Publication Tokukai No. 2007-165284 A (Publication Date: Jun. 28, 2007)
Patent Literature 4
Japanese Patent Application Publication Tokukai No. 2007-139540 A (Publication Date: Jun. 7, 2007)

Non-Patent Literature

Non-Patent Literature 1
Semicond. Sci. Technol., volume 6, pages 305 through 323, 1991

SUMMARY OF INVENTION

Technical Problem

However, Conventional techniques have problems of an insufficient emission intensity and a narrow viewing angle. Therefore, in order to produce a further high-definition display, it is desirable to emit light having a higher luminance and a wide viewing angle.

The present invention was made in view of the problems, and an object of the present invention is to provide (i) a light-emitting element capable of emitting light having a higher luminance and a wide viewing angle, (ii) a display including the light-emitting element, and (iii) a display device including the display.

Solution to Problem

In order to attain the object, a light-emitting element of the present invention is configured to include: a light-emitting layer; a transparent electrode layer being transparent to at least part of light emitted from the light-emitting layer; and a converting layer for converting color of the light, the converting layer and the light-emitting layer sandwiching the transparent electrode layer therebetween, the converting layer containing particles expressing a surface plasmon phenomenon.

According to the configuration, the particles are present outside the transparent electrode layer when being viewed from the light-emitting layer. Therefore, the particles are not directly affected by an electric field, and a plasmon phenomenon is expressed in the converting layer, whereby an emission intensity is increased. Further, the light is scattered by the particles, and therefore a viewing angle is widened. It is therefore possible to emit light having a high luminance and a wide viewing angle.

Further, in order to attain the object, a display of the present invention is configured to include the light-emitting element of the present invention, and a display device of the present invention is configured to include the display of the present invention.

According to the configurations, it is possible to produce a display and a display device each having a higher luminance, a wide viewing angle, and a high definition.

Advantageous Effects of Invention

A light-emitting element of the present invention includes: a light-emitting layer; a transparent electrode layer being transparent to at least part of light emitted from the light-emitting layer; and a converting layer for converting color of the light, the converting layer and the light-emitting layer sandwiching the transparent electrode layer therebetween, the converting layer containing particles expressing a surface plasmon phenomenon. Therefore, the light-emitting element can emit light having a higher luminance and a wide viewing angle.

DESCRIPTION OF EMBODIMENTS

Figure 1:
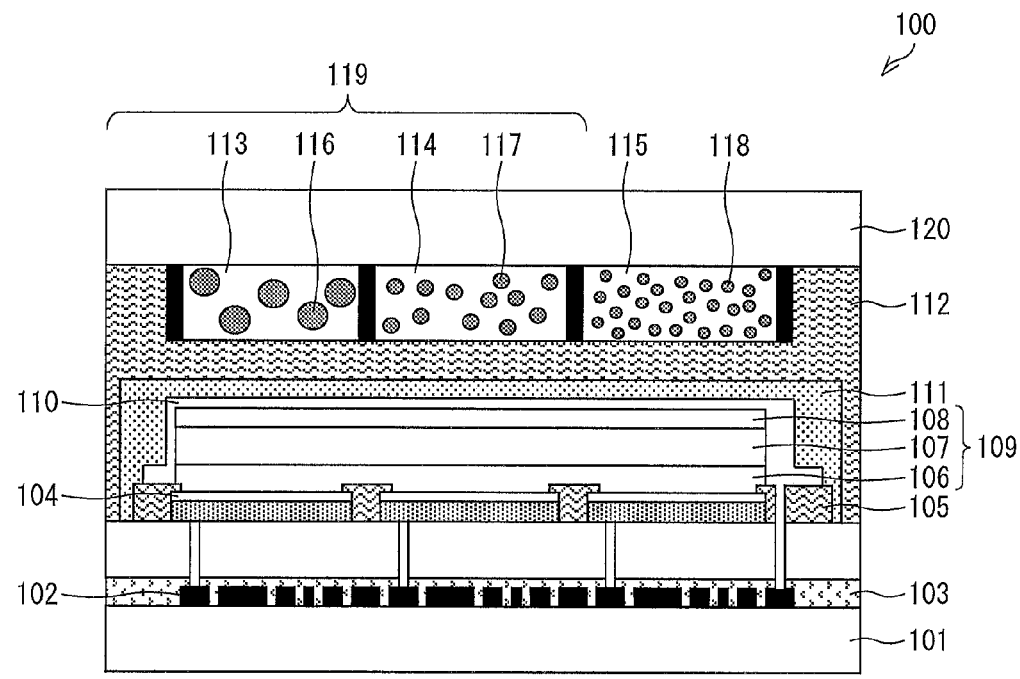
FIG. 1 is a cross-sectional view schematically illustrating an organic EL element in accordance with an embodiment of the present invention.

The following describes in detail an embodiment of the present invention with reference to FIG. 1. FIG. 1 is a cross-sectional view schematically illustrating an organic EL element 100 (light-emitting element) in accordance with the present embodiment.

The organic EL element 100 includes a substrate 101, a TFT circuit 102, an insulating film 103, a first electrode layer 104, an edge cover 105, a light-emitting layer 109, a second electrode layer 110, a sealing film 111, a sealing layer 112, a transparent layer 115, a color converting layer 119, and a sealing substrate 120.

The following describes components of the organic EL element 100 of the present embodiment.

(Substrate 101)

Examples of the substrate 101 encompass (i) insulating substrates such as (a) a substrate made from an inorganic material e.g., glass or quartz, (b) a plastic substrate containing e.g., polyethylene terephthalate, polycarbazole or polyimide, and (c) a ceramic substrate containing e.g., alumina, (ii) a metal substrate containing e.g., aluminum (Al) or iron (Fe), (iii) a substrate whose surface is coated with an insulating material such as silicon oxide ($SiO_2$) or an organic insulating material, and (iv) a metal substrate containing e.g., aluminum, which metal substrate has a surface subjected to an insulating process by means of, for example, anodization. However, the substrate 101 is not limited to the examples.

The substrate 101 is preferably a plastic substrate or a metal substrate so as to be curved or bended without being stressed. The substrate 101 is further preferably a plastic substrate coated with an inorganic material, or a metal substrate coated with an inorganic insulating material. The substrate 101 thus coated can prevent an organic EL element from being deteriorated by moisture transmission, which is a biggest problem caused when a plastic substrate is employed as an organic EL substrate (it is known that an organic EL element is deteriorated even by a small amount of moisture). Further, the substrate 101 thus coated can prevent a leak (short circuit) caused due to projections of a metal substrate, which is a biggest problem caused when the metal substrate is employed as an organic EL substrate (it is known that electric current through a pixel part notably leaks (the pixel part is short-circuited) due to projections because an organic EL element has a remarkably thin thickness of approximately 100 through 200 nm).

The substrate 101 is preferably a substrate which neither melts nor bends at temperatures of not more than 500° C. in a case where a TFT circuit is formed on the substrate. Further, it is possible to form TFTs on a metal substrate at a low cost by use of a conventional production device, by employing a metal substrate made from an alloy of iron and nickel, which alloy has a linear expansion coefficient of not more than $1 \times 10^{-5}/°$ C., which linear expansion coefficient is equivalent to that of glass, whereas it is difficult to form TFTs on a general metal substrate by use of the conventional production device because the general metal substrate has a thermal expansion coefficient different from that of glass. Further, it is possible to form a TFT circuit on a plastic substrate by transferring, to the plastic substrate, the TFT circuit formed on a glass substrate though the plastic substrate is remarkably weak against heat.

The substrate 101 can be made from glass. The substrate 101 made from glass does not transform even during a high-temperature process, and does not transmit moisture. It is therefore possible to prevent the organic EL element 100 from being deteriorated.

There is no limitation on a substrate in a case where light emitted from a light-emitting layer does not pass through the substrate. Meanwhile, in a case where light emitted from the light-emitting layer passes through the substrate, the substrate should be transparent or semi-transparent. It should be noted that the present invention is not limited to the above-described materials and methods for forming the substrate 101.

(TFT Circuit 102)

The TFT circuit 102 is provided on the substrate 101.

The TFT circuit 102 is formed in advance on the substrate 101 before the organic EL element is formed. The TFT circuit 102 functions as a switching circuit and a driving circuit. The TFT circuit 102 of the organic EL element of the present invention can have a configuration of a conventional TFT circuit. Alternatively, a metal-insulator-metal (MIM) diode can be substituted for the TFT circuit 102.

A TFT circuit mountable in an active driving organic EL display and in an organic EL display device each employing the organic EL element of the present invention can be made from a conventional material by a conventional method so as to have a conventional configuration. An active layer of the TFT circuit can be made from, for example, (i) an inorganic semiconducting material such as amorphous silicon, polycrystalline silicon (polysilicon), microcrystalline silicon, and cadmium selenide, (ii) an oxide semiconducting material such as zinc oxide, and indium oxide-gallium oxide-zinc oxide, and (iii) an organic semiconducting material such as a polythiophene derivative, thiophene oligomer, a poly(p-pherylenevinylene) derivative, naphthalene, and pentacene. The TFT circuit can have a staggered structure, an inversely staggered structure, a top-gate structure, a coplanar structure or like structure.

The active layer of the TFT circuit can be formed by, for example, (1) performing ion doping with respect to amorphous silicon formed by a plasma enhanced chemical vapor deposition (PECVD) method, (2) forming amorphous silicon by a low-pressure chemical vapor deposition (LPCVD) method employing silane ($SiH_4$) gas, crystallizing the amorphous silicon by a solid phase growth method so as to produce polysilicon, and then performing ion doping with respect to the polysilicon by an ion implantation method, (3) forming amorphous silicon by an LPCVD method employing $Si_2H_6$ gas or by a PECVD method employing $SiH_4$, annealing the amorphous silicon by laser such as excimer laser, crystallizing the amorphous silicon so as to produce polysilicon, and then performing ion doping with respect to the polysilicon (low temperature process), (4) forming a polysilicon layer by an LPCVD method or by a PECVD method, thermally oxidizing the polysilicon layer at temperatures of not less than 1000° C. so as to form a gate insulating film, forming $n^+$ polysilicon gate electrodes on the gate insulating film, and then performing ion doping (high temperature process), (5) forming an organic semiconducting material by an inkjet method or like method, or (6) forming a single crystal film of an organic semiconducting material.

A gate insulating film of the TFT circuit can be made from a conventional material. Examples of the conventional material encompass (i) $SiO_2$ formed by a PECVD method, an LPCVD method or like method, and (ii) $SiO_2$ formed by thermally oxidizing a polysilicon film. Further, it is possible to make a signal electrode line, a scanning electrode line, a common electrode line, a first driving electrode, and a second driving electrode for the TFT circuit of the present invention from conventional materials. Examples of the conventional materials encompass tantalum (Ta), aluminum (Al), and copper (Cu). The TFT circuit of an organic EL panel of the present invention can be thus configured. It should be noted that the present invention is not limited to the above-described material, configuration, and method for forming the TFT circuit.

(Insulating Film 103)

The insulating film 103 is provided between the TFT circuit 102 and the first electrode layer 104.

The insulating film 103 can be made from a conventional material. Examples of the conventional material encompass (i) inorganic materials such as silicon oxide ($SiO_2$), silicon nitride (SiN or $Si_2N_4$), and tantalum oxide (TaO or $Ta_2O_5$), and (ii) organic materials such as acrylic resin and resist materials. The insulating film 103 can be formed by, for example, (i) a dry process such as a chemical vapor deposition (CVD) method, and a vacuum evaporation method or (ii) a wet process such as a spin coating method. The insulating film 103 can be patterned by a photolithography method, if necessary.

According to the present embodiment, light emitted from the light-emitting layer 109 is emitted toward the second electrode layer 110. Therefore, the insulating film 103 is preferably a light-shielding insulating film that also has a light-shielding property so as to prevent a TFT property of the TFT circuit from being changed by external light entering the TFT circuit formed on the TFT substrate. A light-shielding insulating film can be used in combination with the insulating film 103. The light-shielding insulating film can be made from, for example, (i) polymeric resin such as polyimide in which pigment or dye, such as phtalocyanine and quinacridon, is dispersed, or (ii) inorganic insulating materials such as color resist, black matrix materials, and $Ni_xZn_yFe_2O_4$. It should be noted that the present invention is not limited to the above-described materials and methods for forming the insulating film 103.

Formation of TFTs etc. on a substrate causes the substrate to have an uneven surface formed thereon. This may cause a defect of an organic EL element (such as a defect of an pixel electrode, a defect of a light-emitting layer, an electrical disconnection of a counter electrode, a short circuit between a pixel electrode and a counter electrode, and reduction in pressure resistance). In order to prevent such defects, a flattening film can be formed on an insulating film.

The flattening film can be made from a conventional material. Examples of the conventional material encompass (i) inorganic materials such as silicon oxide, silicon nitride, and tantalum oxide, and (ii) organic materials such as polyimide, acrylic resin, and resist materials. The flattening film can be formed by, for example, (i) a dry process such as a CVD method, and a vacuum evaporation method or (ii) a wet process such as a spin coating method. It should be noted that the present invention is not limited to the above-described materials and methods for forming the flattening film. Further, the flattening film can be a single layer film or a multilayer film.

(Light-Emitting Layer 109)

The light-emitting layer 109 is provided between the first electrode layer 104 and the second electrode layer 110.

The light-emitting layer 109 is made up of a hole transporting layer 106, a light emitter layer 107, and an electron transporting layer 108 which are sequentially layered. The light emitter layer 107 emits blue light.

The light-emitting layer of the organic EL element of the present invention is not limited to the configuration of the present embodiment. The light-emitting layer can be a single layer of a light emitter layer. Alternatively, the light-emitting layer can be a multilayer of a light emitter layer, a hole transporting layer, and an electron transporting layer. The following (1) through (9) exemplify structures of the light-emitting layer. It should be noted that the present invention is not limited to the following (1) through (9).

(1) A light emitter layer (2) A hole transporting layer, and a light emitter layer (3) A light emitter layer, and an electron transporting layer (4) A hole transporting layer, a light emitter layer, and an electron transporting layer (5) A hole injecting layer, a hole transporting layer, a light emitter layer, and an electron transporting layer (6) A hole injecting layer, a hole transporting layer, a light emitter layer, an electron transporting layer, and an electron injecting layer (7) A hole injecting layer, a hole transporting layer, a light emitter layer, a hole preventing layer, and an electron transporting layer (8) A hole injecting layer, a hole transporting layer, a light emitter layer, a hole preventing layer, an electron transporting layer, and an electron injecting layer (9) A hole injecting layer, a hole transporting layer, an electron preventing layer, a light emitter layer, a hole preventing layer, an electron transporting layer, and an electron injecting layer Note that each of the light emitter layer, the hole injecting layer, the hole transporting layer, the hole preventing layer, the electron preventing layer, the electron transporting layer, and the electron injecting layer can be a single layer or a multilayer.

The light-emitting layer 109 is preferably configured so as to express a micro cavity effect. It is further desirable that the light-emitting layer 109 be configured so as to express a micro cavity effect by, for example, having a thickness that matches a wavelength of light to be reinforced. Note that a light-emitting layer is sandwiched between a pair of electrode layers in an organic EL pixel. One of the pair of electrode layers is made from a total reflection material having a mirror surface, and the other of the pair of electrode layers is made from a semi-transparent material of a dielectric mirror. Further, the light-emitting layer can have different thicknesses so as to emit light having a wavelength of R, G or B light to be reinforced. A light component having a misaligned wavelength, among light emitted from the light-emitting layer thus configured, is continuously subjected to multiple reflection, resonated between the pair of electrode layers, and therefore reinforced to have a desired wavelength, and then emitted. Therefore, the light emitted from the light-emitting layer converges in the front side of the light-emitting layer (has a directivity), and loss of light which escapes to a periphery of the light-emitting layer is reduced, whereby an efficiency at which light is emitted in the front side of the light-emitting layer is improved. This allows the light to be more efficiently transported to a color converting layer, and allows a luminance in the front side of the light-emitting layer to be improved. Further, it is possible to adjust an emission spectrum by an interference effect, or by an adjustment to a desired emission peak wavelength and half band width. Furthermore, it is possible to (i) control the emission spectrum to be a spectrum which enables a red phosphor and a green phosphor to be more effectively excited, and (ii) improve a color purity of a blue pixel.

The light emitter layer 107 can be made just from the following exemplified organic light-emitting materials. Alternatively, the light emitter layer 107 can be made from a combination of luminous dopant and a host material. Further, the light emitter layer 107 can arbitrarily contain materials such as a hole transporting material, an electron transporting material, and an additive (for example, donors or acceptors). Furthermore, the light emitter layer 107 can contain a polymeric material (binding resin) or an inorganic material in which the materials are dispersed. The light emitter layer 107 is preferably made from a host material in which luminous dopant is dispersed, from the viewpoint of an emission efficiency and a life of the light emitter layer 107.

Examples of the organic light-emitting materials encompass conventional light-emitting materials for organic EL. Such conventional light-emitting materials are classified into low-molecular light-emitting materials, polymeric light-emitting materials, and like materials. The following exemplifies concrete compounds of the organic light-emitting materials. It should be noted that the present invention is not limited to the compounds. The organic light-emitting materials include fluorescent materials and phosphorescent light materials. The organic light-emitting materials are preferably phosphorescent light materials having a high emission efficiency, from the viewpoint of low power consumption.

The following exemplifies concrete compounds of the organic light-emitting materials. It should be noted that the present invention is not limited to the compounds.

Examples of low-molecular organic light-emitting materials encompass (i) an aromatic dimethylidene compound such as 4,4'-bis(2,2'-diphenylvinyl)-biphenyl (DPVBi), (ii) an oxadiazole compound such as 5-methyl-2-[2-[4-(5-methyl-2-benzoxazolyl)phenyl]vinyl]benzoxazole, (iii) a triazole derivative such as 3-(4-biphenylyl)-4-phenyl-5-t-butylphenyl-1,2,4-triazole (TAZ), (iv) a styryl benzene compound such as 1,4-bis(2-methylstyryl)benzene, and (v) a fluorescent organic material such as a fluorenone derivative.

Examples of the polymeric light-emitting materials encompass (i) a polyphenylenevinylene derivative such as poly(2-decyloxy-1,4-phenylene) (DO-PPP), and (ii) a polyspiro derivative such as poly(9,9-dioctylfluorene) (PDAF).

Examples of the luminous dopant that is arbitrarily contained in the light-emitting layer encompass conventional dopant materials for organic EL. The conventional dopant materials include (i) a fluorescent light emitting material such as a styryl derivative, and (ii) a phosphorescent light emitting organic metal complex such as bis[(4,6-difluorophenyl)-pyridinato-N,C2']picolinate iridium (III) (FIrpic), and bis(4',6'-difluorophenylpyridinato)tetrakis(1-pyrazole)borate iridium (III) (FIr$_6$).

Note that the light-emitting layer 109 of the present invention desirably emits blue light.

Examples of the host material to be used in combination with dopant encompass conventional host materials for organic EL. The conventional host materials include (i) the low-molecular light-emitting materials, (ii) the polymeric light-emitting materials, (iii) carbazole derivatives such as 4,4'-bis(carbazole)biphenyl, 9,9-di(4-dicarbazole-benzyl)fluorene (CPF), 3,6-bis(triphenylsilyl)carbazole (mCP), and (PCF), (iv) an aniline derivative such as 4-(diphenylphosphoryl)-N,N-diphenylaniline (HM-A1), and (v) fluorine derivatives such as 1,3-bis(9-phenyl-9H-fluorene-9-ly)benzene (mDPFB), and 1,4-bis(9-phenyl-9H-fluorene-9-ly)benzene (pDPFB).

Electric charge has a hole and an electron. The hole injecting layer, the hole transporting layer, the electron transporting layer, and the electron injecting layer are employed in order to more efficiently transport (inject) holes and electrons from an electrode to a light emitter layer. The layers can be made just from the following exemplified electric charge injecting/transporting materials. The layers can arbitrarily contain additives such as donors and acceptors. Alternatively, the layers can be made from a polymeric material (binding resin) or an inorganic material in which the following exemplified materials are dispersed.

Examples of the electric charge injecting/transporting materials encompass conventional materials for organic EL or organic photoconductors. The electric charge injecting/transporting materials are classified into hole injecting/transporting materials and electron injecting/transporting materials. The following exemplifies concrete compounds of the electric charge injecting/transporting materials. It should be noted that the present invention is not limited to the compounds.

The hole injecting layer and the hole transporting layer can be made from, for example, (i) an oxide such as vanadium oxide ($V_2O_5$) and molybdenum oxide ($MoO_2$), (ii) an inorganic p-type semiconducting material, (iii) a low-molecular material such as (a) a porphyrin compound, (b) an aromatic tertiary amine compound (for example, N,N'-bis(3-methylphenyl)-N,N'-bis(phenyl)-benzidine (TPD) or N,N'-di (naphthalene-1-ly)-N,N'-diphenyl-benzidine (NPD)), (c) a hydrazone compound, (d) a quinacridon compound and (d) a styryl amine compound, or (iv) a polymeric material such as polyanilin (PANI), polyanilin-camphor sulfone acid (PANI-CSA), 3,4-polyethylenedioxithiophene/polystyrenesulphonate (PEDOT/PSS), a poly(triphenyl amine) derivative (Poly-TPD), polyvinylcarbazole (PVCz), poly(p-phenylenevinylene) (PPV), and poly(p-naphthalenevinylene) (PNV).

It is preferable from the viewpoint of further efficient injection and transportation of holes from an anode that the hole injecting layer be made from a material having an energy level of a highest occupied molecular orbital (HOMO) lower than that of a material from which the hole transporting layer is made, and the hole transporting layer be made from a material having a hole mobility higher than that of the material from which the hole injecting layer is made.

Further, it is preferable that acceptors be doped so as to further improve injection and transportation of holes. The acceptors can be made from conventional acceptor materials for organic EL. The following exemplifies concrete compounds of the conventional acceptor materials. It should be noted that the present invention is not limited to the compounds.

Examples of the conventional acceptor materials encompass (i) inorganic materials such as Au, Pt, W, Ir, $POC_{13}$, $AsF_6$, Cl, Br, I, vanadium oxide ($V_2O_5$), and molybdenum oxide ($MoO_2$), and (ii) organic materials such as (a) a compound having a cyano group, such as TCNQ (7,7,8,8,-tetracyano quinodimethan), $TCNQF_4$ (tetrafluorotetracyanoquinodimethan), TCNE (tetracyanoethylene), HCNB (hexacyanobutadiene), and DDQ (dicyclodicyanobenzoquinone), (b) a compound having a nitro group, such as TNF (trinitrofluorenone), and DNF (dinitrofluorenone), (c) fluoranil, (d) chloranil and (e) bromanil. Among these, the compound having a cyano group, such as TCNQ, $TCNQF_4$, TCNE, HCNB and DDQ, is preferably employed because the compound can effectively increase a carrier concentration.

The electron injecting layer and the electron transporting layer can be made from, for example, (i) an inorganic material that is an n-type semiconductor, (ii) a low-molecular material such as an oxadiazole derivative, a triazole derivative, a thiopyrazinedioxide derivative, a benzoquinone derivative, a naphthoquinone derivative, an anthraquinone derivative, a difenoquinone derivative, a fluorenone derivative, and a benzodifuran derivative, or (iii) a polymeric material such as poly-(oxadiazole) (Poly-OXZ) and a polystyrene derivative (PSS). It is particularly preferable that the electron injecting layer be made from, for example, (i) a fluoride, such as lithium fluoride (LiF) and barium fluoride ($BaF_2$), or (ii) an oxide such as lithium oxide ($Li_2O$).

It is preferable from the viewpoint of further efficient injection and transportation of electrons from a cathode that the electron injecting layer be made from a material having an energy level of a lowest occupied molecular orbital (LOMO) higher than that of a material from which the electron transporting layer is made, and the electron transporting layer be made from a material having an electron mobility higher than that of the material from which the electron injecting layer is made.

Further, it is preferable that donors be doped into the material from which the electron injecting layer is made and the material from which the electron transporting layer is made, so as to further improve an injection efficiency and a transportability of electrons. The donors can be made from conventional donor materials for organic EL. The following exemplifies concrete compounds of the conventional donor materials. It should be noted that the present invention is not limited to the compounds.

Examples of the conventional donor materials encompass (i) inorganic materials such as alkali metal, alkaline earth metal, rare earth elements, Al, Ag, Cu and In, and (ii) organic materials such as (a) a compound having a frame of aromatic tertiary amine, such as anilines, phenylenediamines, benzidines (for example, N,N,N',N'-tetraphenylbenzidine, N,N'-bis-(3-methylphenyl)-N,N'-bis-(phenyl)-benzidine, and N,N'-di(naphthalene-1-yl)-N,N'-diphenyl-benzidine), triphenylamines (for example, triphenylamine, 4,4',4"-tris(N,N-diphenyl-amino)-triphenylamine, and 4,4',4"-tris(N-3-methylphenyl-N-phenyl-amino)-triphenylamine, and 4,4',4"-tris (N-(1-naphthyl)-N-phenyl-amino)-triphenylamine), and triphenyldiamines (for example, N,N'-di-(4-methyl-phenyl)-N,N'-diphenyl-1,4-phenylenediamine), (b) a fused polycyclic compound such as phenanthrene, pyrene, perylene, anthracene, tetracene, and pentacene (note that the fused polycyclic compound can have a substituent), (c) TTFs (for example, tetrathiafulvalenes), (d) dibenzofuran, (e) phenothiazine, and (f) carbazole. Among these, it is preferable to employ the compound having a frame of aromatic tertiary amine, the fused polycyclic compound, or the alkali metal because they can effectively increase a carrier concentration.

The light-emitting layer including the hole injecting layer, the hole transporting layer, the light emitter layer, the electron transporting layer, and the electron injecting layer can be formed by use of a light-emitting layer forming solution which is obtained by dissolving and dispersing, in a solvent, the above-described materials from which the hole injecting layer, the hole transporting layer, the light emitter layer, the electron transporting layer, and the electron injecting layer are made. The forming may be carried out by (i) a conventional wet process such as (a) a coating method (for example, a spin coating method, a dipping method, a doctor blade method, a discharge coating method, or a spray coating method) and (b) a printing method (for example, an inkjet method, a letterpress method, an intaglio printing method, a screen printing method, or a micro gravure coating method), (ii) a conventional dry process such as a resistive heating vapor deposition method, an electron beam (EB) vapor deposition method, a molecular beam epitaxy (MBE) method, a sputtering method, and an organic vapor phase deposition (OVPD) method, or (iii) a laser transfer method. Note that a light-emitting layer forming solution, by use of which the light-emitting layer is formed by a wet process, can contain an additive, such as a leveling agent and a viscosity adjusting agent, for adjusting a physical property of the light-emitting layer forming solution.

Each thickness of the hole injecting layer, the hole transporting layer, the light emitter layer, the electron transporting layer, and the electron injecting layer ranges, for example, from approximately 1 to 1000 nm. The thickness preferably ranges from 10 to 200 nm. A layer having a thickness of less than 10 nm cannot have originally necessitated physical properties (such as an electric charge injection property, a transportability, and a confinement property), and may cause a pixel defect due to contamination with a foreign substance such as dust. A layer having a thickness of more than 200 nm causes an increase in driving voltage due to resistance components of the light-emitting layer. This results in increase in power consumption.

(First Electrode Layer 104 and Second Electrode Layer 110 (A Pair of Electrode Layers))

The first electrode layer 104 is formed above the TFT circuit 102 via the insulating film 103.

The second electrode layer 110 is formed on the light-emitting layer 109.

The first electrode layer 104 and the second electrode layer 110 sandwich the light-emitting layer 109 therebetween.

An electrode layer (one of a pair of electrode layers) of the first electrode layer 104 and the second electrode layer 110, through which electrode layer light emitted from the light-emitting layer 109 passes, should be transparent to at least part of the light (a transparent electrode layer). According to the present embodiment, light emitted from the light-emitting layer 109 passes through the second electrode layer 110. It should be noted that the present invention is not limited to this. The first electrode layer 104 can be configured to transmit the light emitted from the light-emitting layer 109, and the second electrode layer 110 can be configured to reflect the light emitted from the light-emitting layer 109.

The first electrode layer 104 and the second electrode layer 110 function in pairs as an anode and a cathode of the organic EL element 100, respectively, and vice versa. That is, the first electrode layer 104 functions as an anode while the second electrode layer 110 functions as a cathode. The first electrode layer 104 functions as a cathode while the second electrode layer 110 functions as an anode. The following exemplifies concrete compounds and methods for forming the first electrode layer 104 and the second electrode layer 110. It should be noted that the present invention is not limited to the following compounds and methods.

The first electrode layer 104 and the second electrode layer 110 can be made from conventional electrode materials. From the viewpoint of further efficient injection of holes into the light-emitting layer 109, the first electrode layer 104 or the second electrode layer 110 that functions as an anode is preferably made from, for example, a transparent electrode material having a work function of not less than 4.5 eV, such as (i) a metal (for example, gold (Au), platinum (PT), or nickel (Ni)), (ii) an oxide containing indium (In) and tin (Sn) (ITO), (iii) an oxide of tin (Sn) ($SnO_2$), and (iv) an oxide containing indium (In) and zinc (Zn) (IZO). From the viewpoint of further efficient injection of holes into the light-emitting layer 109, the first electrode layer 104 or the second electrode layer 110 that functions as a cathode is preferably made from, for example, an electrode material having a work function of not more than 4.5 eV, such as (i) a metal (for example, lithium (Li), calcium (Ca), cerium (Ce), barium (Ba), or aluminum (Al)), and (ii) an alloy (for example, an alloy of magnesium and silver, or an alloy of lithium and aluminum).

The first electrode layer 104 and the second electrode layer 110 can be formed with the above-described materials by a conventional method such as an EB vapor deposition method, a sputtering method, an ion plating method, and a resistive heating vapor deposition method. It should be noted that the present invention is not limited to the methods. A formed electrode can be patterned by a photolithography method or a laser separation method, if necessary. Further, an electrode can be directly patterned in combination with a shadow mask. The electrode preferably has a thickness of not less than 50 nm. An electrode having a thickness of less than 50 nm has an increased resistance to wiring. This may increase a driving voltage.

The second electrode layer 110 is preferably a semi-transparent electrode, in a case where a micro cavity effect should be expressed in order to, for example, improve a color purity, an emission efficiency, and front luminance. The semi-transparent electrode can be a metal semi-transparent electrode, or can be made from a combination of a material from which a metal semi-transparent electrode is made and a material from which a transparent electrode is made. Among these, silver is preferably employed from the viewpoint of reflectivity and transmittance. The semi-transparent electrode preferably has a thickness of 5 through 30 nm. A semi-transparent electrode having a thickness of less than 5 nm can neither sufficiently reflect light nor have a sufficient interference effect. A semi-transparent electrode having a thickness of more than 30 nm rapidly decreases light transmittance. This may decrease luminance and efficiency of light. Meanwhile, the first electrode layer 104 is preferably an electrode having a high light reflectivity. The electrode having such a high light reflectivity can be (i) a reflective metal electrode made from, for example, aluminum, silver, gold, an alloy of aluminum and lithium, an alloy of aluminum and neodymium, or an alloy of aluminum and silicon, or (ii) a combination of a transparent electrode and a reflective metal electrode (reflective electrode).

(Edge Cover 105)

The edge cover 105 seals an edge of the first electrode layer 104.

It is preferable that the edge of the first electrode layer 104 formed in a substrate 101 side in the organic EL element 100 be covered with the edge cover 105, so that it is possible to prevent a leak caused between the first electrode layer 104 and the second electrode layer 110. The edge cover 105 can be formed with an insulating material by a conventional method such as an EB vapor deposition method, a sputtering method, an ion plating method, and a resistive heating vapor deposition method. Further, the edge cover 105 can be patterned by a photolithography method of conventional dry and wet processes. Note that a method for forming an edge cover in an organic EL element of the present invention is not limited to the above-described method. The insulating material is not particularly limited but can be made from conventional materials provided that the insulating material is transparent to light. Examples of the insulating material encompass SiO, SiON, SiN, SiOC, SiC, HfSiON, ZrO, HfO, and LaO. The insulating material preferably has a thickness of 100 through 2000 nm. An insulating material having a thickness of less than 100 nm does not have a sufficient insulating property but may cause a leak between the first electrode layer 104 and the second electrode layer 110. This possibly causes an increase in power consumption, and no emission of light. Meanwhile, in a case of an insulating material having a thickness of more than 2000 nm, it takes long to form the insulating material. This may cause a reduction in productivity, and may cause an electric disconnection of the second electrode layer due to an edge cover made from the insulating material having such a thick thickness.

(Sealing Film 111, Sealing Layer 112, and Sealing Substrate 120)

The sealing film 111 is formed on the second electrode layer 110. The sealing layer 112 is formed on the sealing film 111. The color converting layer 119 is formed on the sealing layer 112 (later described), and the sealing substrate 120 is provided on the color converting layer 119.

It is preferable that the sealing film or the sealing substrate be thus provided in an organic EL illumination device employing a display, a display device, and the organic EL element of the present invention. The sealing film and the sealing substrate can be formed with a conventional sealing material by a conventional sealing method. An example of the conventional sealing method is a method for sealing inert gas, such as nitrogen gas and argon gas, with glass, metal or like material. It is further preferable that the inert gas thus sealed be mixed with, for example, a moisture absorbing agent made from barium oxide, so that it is possible to further effectively suppress deterioration of the organic EL element caused by moisture. The sealing film can be formed by (i) applying a resin onto the second electrode layer 110 by a spin coating method, an ODF method, or a laminating method, or (ii) bonding a resin onto the second electrode layer 110. Alternatively, the sealing film can be formed by forming, on the second electrode layer 110, an inorganic film of, for example, SiO, SiON, or SiN by a plasma CVD method, an ion plating method, an ion beam method, a sputtering method, or like method, and then by (i) applying a resin onto the inorganic film by a spin coating method, an ODF method, or a laminating method, or (ii) bonding a resin onto the inorganic film. The sealing film thus formed can prevent oxygen or moisture from entering the organic EL element from outside, whereby a life of the organic EL element is improved. It should be noted that the present invention is not limited to the above-described materials and methods. In a case where light is emitted to a second electrode layer 110 side, the sealing film 111 and the sealing substrate 120 are made from light transparent materials.

(Color Converting Layer 119 and Transparent Layer 115)

The color converting layer 119 sandwiches, with the light-emitting layer 109, the second electrode layer 110 that is transparent to light emitted from the light-emitting layer 109.

The color converting layer 119 is formed above the sealing film 111 via the sealing resin 112.

The color converting layer 119 is made up of a red fluorescent layer 113 and a green fluorescent layer 114. The transparent layer 115 transmits blue light, and adjusts an orientation of blue light. The red fluorescent layer 113, the green fluorescent layer 114, and the transparent layer 115 contain fine particles (particles) 116, fine particles (particles) 117, and fine particles (particles) 118, respectively. The fine particles (particles) 116, 117, and 118 can express a surface plasmon phenomenon.

In the organic EL element 100, blue light emitted from the light-emitting layer 109 is transported to the color converting layer 119. Blue light that enters the red fluorescent layer 113 is converted into red light, and then the red light is emitted from the red fluorescent layer 113. Blue light that enters the green fluorescent layer 114 is converted into green light, and then the green light is emitted from the green fluorescent layer 114. Blue light that enters the transparent layer 115 is subjected to an orientation adjustment, and then emitted from the transparent layer 115 as it is. The red fluorescent layer 113, the green fluorescent layer 114, and the transparent layer 115 thus contain the fine particles 116, the fine particles 117, and the fine particles 118, respectively. This allows to the red fluorescent layer 113, the green fluorescent layer 114, and the transparent layer 115 to express a surface plasmon phenomenon, thereby reinforcing an intensity of emission light. It is therefore possible to emit light having a higher luminance.

The red fluorescent layer 113 and the green fluorescent layer 114 each can be made just from the following exemplified fluorescent materials. The red fluorescent layer 113 and the green fluorescent layer 114 each can arbitrarily contain an additive or like material. Alternatively, the red fluorescent layer 113 and the green fluorescent layer 114 each can be made from a polymeric material (binding resin) or an inorganic material in which the fluorescent materials are dispersed.

It is preferable that a black matrix be formed between the fluorescent layers.

The fluorescent materials of the present invention can be conventional fluorescent materials. The conventional fluorescent materials are classified into organic fluorescent materials and inorganic fluorescent materials. The following exemplifies concrete compounds of the organic fluorescent materials and the inorganic fluorescent materials. It should be noted that the present invention is not limited to the compounds.

Examples of a fluorescent dye of the organic fluorescent materials, which fluorescent dye converts blue excitation light into green light, encompass (i) coumarin dye such as 2,3,5,6-1H,4H-tetrahydro-8-trifluoromethy quinolizidine (9,9a,1-gh) coumarin (coumarin 153), 3-(2'-benzothiazolyl)-7-diethylaminocoumarin (coumarin 6), and 3-(2'-benzoimidazolyl)-7-N,N-diethylaminocoumarin (coumarin 7), and (ii) naphthalimido dye such as basic yellow 51, solvent yellow 11, and solvent yellow 116. Examples of a fluorescent dye of the organic fluorescent materials, which fluorescent dye converts blue excitation light into red light, encompass (i) cyanine dye such as 4-dicyanomethylene-2-methyl-6-(p-dimethylaminostyryl)-4H-pyran, (ii) pyridine dye such as 1-ethyl-2-[4-(p-dimethylaminophenyl)-1,3-butadienyl]-pyridium-perchlorate, and (iii) rhodamine dye such as rhodamine B, rhodamine 6G, rhodamine 3B, rhodamine 101, rhodamine 110, basic violet 11, and sulforhodamine 101.

Examples of a phosphor made from the inorganic fluorescent materials, which phosphor converts blue excitation light into green light, encompass $(BaMg)Al_{16}O_{27}:Eu^{2+}$, $Mn^{2+}$, $Sr_4Al_{14}O_{25}:Eu^{2+}$, $(SrBa)Al_{12}Si_2O_8:Eu^{2+}$, $(BaMg)_2SiO_4:Eu^{2+}$, $Y_2SiO_5:Ce^{3+}$, $Tb^{3+}$, $Sr_2P_2O_7-Sr_2B_2O_5:Eu^{2+}$, $(BaCaMg)_5(PO_4)3Cl:Eu^{2+}$, $Sr_2Si_3O_8\cdot 2SrCl_2:Eu^{2+}$, $Zr_2SiO_4$, $MgAl_{11}O_{19}:Ce^{3+}$, $Tb^{3+}$, $Ba_2SiO_4:Eu^{2+}$, $Sr_2SiO_4:Eu^{2+}$, and $(BaSr)SiO_4:Eu^{2+}$. Examples of a phosphor made from the inorganic fluorescent materials, which phosphor converts blue excitation light into red light, encompass $Y_2O_2S:Eu^{3+}$, $YA_1O_3:Eu^{3+}$, $Ca_2Y_2(SiO_4)6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P,V)O_4:Eu^{3+}$, $Mg_4GeO_{5.5}F:Mn^{4+}$, $Mg_4GeO_6:Mn^{4+}$, $K_5Eu_{2.5}(WO_4)_{6.25}$, $Na_5EU_{2.5}(WO_4)_{6.25}$, $K_5EU_{2.5}(MoO_4)_{6.25}$, and $Na_5Eu_{2.5}(MoO_4)_{6.25}$. An inorganic phosphor can be subjected to a surface modifying process, if necessary. The surface modifying process is carried out by, for example, (i) chemically processing, for example, a silane coupling agent, (ii) carrying out a physical process such as adding fine particles of submicron order, or (iii) carrying out the chemical process and the physical process in combination. The fluorescent layers are preferably made from an inorganic material in consideration of stability which may be impaired by, for example, deterioration of the fluorescent layers due to excitation light and emission light. An inorganic fluorescent layer made from the inorganic material preferably has an average particle diameter (d50) of 1 through 50 μm. An inorganic fluorescent layer having an average particle diameter of less than 1 μm rapidly decreases its emission efficiency. Meanwhile, in a case of an inorganic fluorescent layer having an average particle diameter of more than 50 μm, it is remarkably difficult to make the inorganic layer flat, and therefore a gap (refractive index: 1.0) is formed between the inorganic fluorescent layer (refractive index: approximately 2.3) and the organic EL element (refractive index: approximately 1.7). The gap prevents light from the organic EL element to efficiently reach the inorganic fluorescent layer. This causes a problem that an emission efficiency of the inorganic fluorescent layer is deceased.

Further, the fluorescent layers can be patterned by use of a photosensitive resin as a polymeric resin by a photolithography method.

Specifically, the fluorescent layers can be patterned by use of (i) one type of photosensitive resins (photo-curable resist materials) having reactive vinyl groups, such as acrylic resin, methacrylic resin, poly vinyl cinnamate resin, and hard rubber resin, or (ii) a combination of the photosensitive resins.

Further, it is possible to form the fluorescent layers by use of a fluorescent layer forming solution which is obtained by dissolving or dispersing, in a solvent, the above-described fluorescent material and resin material. The forming may be carried out by (i) a conventional wet process such as (a) a coating method (e.g. a spin coating method, a dipping method, a doctor blade method, a discharge coating method, or a spray coating method) and (b) a printing method (e.g. an inkjet method, a letterpress method, an intaglio printing method, a screen printing method, or a micro gravure coating method), (ii) a conventional dry process such as a resistive heating vapor deposition method, an electron beam (EB) vapor deposition method, a molecular beam epitaxy (MBE) method, a sputtering method, and an organic vapor phase deposition (OVPD) method, or (iii) a laser transfer method.

Each of the fluorescent layers has a thickness of approximately 100 nm through 100 μm. The fluorescent layer preferably has a thickness of 1 through 100 μm. A fluorescent layer having a thickness of not less than 100 nm can sufficiently absorb blue light emitted from an organic EL element, can improve an emission efficiency, and can improve a color purity by preventing blue transparent light from mixing with a necessitated color. A fluorescent layer having a thickness of not less than 1 μm can further absorb the blue light from the organic EL element, and can reduce the blue transparent light to such an extent that will not adversely affect the color purity. A fluorescent layer having a thickness of 100 μm can sufficiently absorb the blue light from the organic EL element. It is therefore possible to reduce consumption of a material and a material cost while keeping a sufficient efficiency, as compared with a fluorescent layer having a thickness of more than 100 μm.

The fluorescent layer is preferably flattened by, for example, a flattening film. This makes it possible to prevent a gap from being formed between the organic EL element and the fluorescent layer, and to improve an adhesiveness between an organic EL element substrate and a fluorescent layer substrate.

The red fluorescent layer 113 and the green fluorescent layer 114, each of which includes fluorescent particles, are provided outside the second electrode layer 110, and change a color of light emitted from the light-emitting layer. The red fluorescent layer 113 and the green fluorescent layer 114 are made from an inorganic fluorescent material or an organic fluorescent material. The red fluorescent layer 113 and the green fluorescent layer 114 are suitably made particularly from polymers in which the organic fluorescent material is dispersed. Preferable examples of the organic fluorescent material encompass coumarin, rhodamine, fluoresceine, cyanine, porphyrin, naphthalimido, perylene, and quinacridon. This is because they have a high fluorescent quantum yield. A particularly preferable example of the organic fluorescent material is a polymer binder in which an organic fluorescent material having a fluorescent quantum yield of not less than 0.3 is dispersed. The red fluorescent layer 113 and the green fluorescent layer 114 can be made from just one type of the organic fluorescent materials or at least two types of the organic fluorescent materials. Preferable examples of the polymer binder encompass transparent resins such as polymethacrylate, polycarbonate, polyvinyl chloride, polyimide, polyamic-acid, polyolefin, and polystyrene.

The red fluorescent layer 113 and the green fluorescent layer 114 absorb light having a center wavelength λ, which light is emitted from the light-emitting layer, eliminate a directivity of the light, and make the light isotropic. A method for forming such a fluorescence converting film is not limited to a specific method. Such a fluorescence converting film can be formed by various methods. The fluorescence converting film can be formed, for example, by dispersing an organic fluorescent material in a polymer binder, and then forming the fluorescence converting film so as to have a thickness of, for example, 500 through 50000 nm, preferably so as to have a thickness of 1000 through 5000 nm, by a casting method, a spin coating method, a printing method, a bar coating method, an extraction molding method, a roll forming method, a pressing method, a spray method, a roll coating method, or like method. An organic solvent can be employed in the method. Examples of the organic solvent encompass dichloromethane, 1,2-dichloroethane, chloroform, acetone, cyclohexanone, toluene, benzene, xylene, N,N-dimethylformamide, dimethyl sulfoxide, 1,2-dimethoxyethane, and diethyleneglycoldimethylether. Just one type of the organic solvents can be employed in the method. Alternatively, at least two types of the organic solvents can be employed in combination in the method.

The organic EL element 100 is made up of pixels each emitting at least red, green, and blue light. It is possible to obtain a full color video by controlling luminances of the respective pixels as appropriate. Further, phosphors for emitting cyan light, and phosphors for emitting yellow light are preferably added to pixels, if necessary. It is possible to further expand a color reproduction region as compared with a display or a display device including pixels each of which emits red, green, and blue light, by setting, in a chromaticity diagram, color purities of pixels emitting cyan light and pixels emitting yellow light, to be outside a triangle made by three color purity points of pixels emitting red light, pixels emitting green light, and pixels emitting blue light.

It is preferable that a black matrix be formed between the fluorescent layers, and between the fluorescent layers and a light orientation property adjusting layer.

(Fine Particles (Particles) 116, 117, and 118)

The following exemplifies the fine particles 116, 117 and 118. It should be noted that the present invention is not limited to the following examples provide that the fine particles 116, 117 and 118 can excite a surface plasmon phenomenon. What is meant by "surface plasmon phenomenon" is a state in which electrons of fine particles such as metal particles resonate with an electric field of light. The surface plasmon phenomenon is excited by resonation of electrons of, for example, metal particles with near-field optical (evanescent optical) which is generated in a case where (i) light enters a material having a lower refractive index from a material having a higher refractive index at angles of not more than a critical angle, is subjected to total reflection, and then spreads into the material having the lower refractive index, or (ii) light enters an opening whose diameter is smaller than a wavelength of the light, and spreads from the opening.

The fine particles 116, 117, and 118 can be made from metals. Examples of the metals encompass Au, Ag, Al, Pt, Cu, Mn, Mg, Ca, Li, Yb, Eu, Sr, Ba, Na, and an alloy of at least two kinds of metals selected as appropriate from a group consisting of the metals (such as an alloy of Mg and Ag, an alloy of Al and Li, an alloy of Al and Ca, and an alloy of Mg and Li).

Metal fine particles 116, 117 and 118 each having a particle diameter of, for example, 1000 nm, preferably not more than 600 nm, interact with near-field optical and sufficiently excite a surface plasmon phenomenon. It is more preferable that the fine particles 116, 117 and 118 be metal particles showing surface plasmon excited by red or green fluorescence induced by blue excitation light. Even metal fine particles which are directly excited by blue excitation light can reinforce excitation light, and therefore are effective in reinforcing fluorescence.

In a case where light emitted from the light-emitting layer 109 enters a light scattering layer having a lower refractive index from a light emitting layer having a higher refractive index at angles of not more than a critical angle, and is then subjected to total reflection, near-field optical is generated in a region of the light scattering layer, which region extends to not more than several hundreds nm from an interface of the light scattering layer. The near-field optical interacts with free electrons of metal fine particles dispersed in the light scattering layer, and the free electrons, which carry out resonance vibration, emit and scatter light outside the light scattering layer. An intensity peak of emission light depends on (i) a particle diameter of the metal fine particles or (ii) a ratio of a longitudinal length to a lateral length of the metal fine particles.

A fluorescence converting layer, in which metal fine particles each having a particle diameter of, for example, 1000 nm, preferably not more than 600 nm are dispersed, can emit outside scattered light having a desired wavelength, even in a case where light emitted from the light-emitting layer 109 has different wavelengths. A light scattering layer, in which several types of shapes of metal fine particles different in ratio of a longitudinal length to a lateral length of the metal fine particles are dispersed, can yield an effect identical to that yielded by the fluorescence converting layer. Accordingly, the fine particles 116, 117, and 118 each can have a sphere shape, or a shape other than the sphere shape. Alternatively, the fine particles 116, 117, and 118 each can have at least two different-shaped cross sections orthogonal to each other. Examples of shapes of the cross sections encompass a pillar shape, a plate shape, a needle shape, a conical shape, a triangular prism, a triangular pyramid, a quadrangular prism, and a quadrangular pyramid. However, the shapes of the cross sections are not limited to the examples. Sphere-shaped fine particles 116, 117, and 118 locally express isotropic plasmon. Meanwhile, fine particles 116, 117, and 118, each of which has at least two different-shaped cross sections orthogonal to each other, locally express anisotropic plasmon. Note, however, that in a case where the fine particles 116, 117 and 118 are uniformly dispersed in the respective layers, the respective layers can emit isotropic light.

Each of the fine particles 116, 117, and 118 can be made from metal and dielectric. For example, each of the fine particles 116, 117, and 118 can have a substantially sphere core region made from dielectric, and a metal thin film covering a surface of the substantially sphere core region. What is meant by "dielectric" is neither a conductor nor a semiconductor but an insulator which does not conduct direct current. Examples of the insulator encompass (i) polymers of, for example, polystyrene, and (ii) silica. Note, however, that the insulator is not limited to the examples. A light scattering layer, in which several types of metal fine particles different in sizes of a core region and a metal thin film of the metal fine particles are dispersed, can emit outside scattered light having a desired wavelength even in a case where light emitted from a light-emitting layer has different wavelengths.

The metal fine particles can be agglomerations of a plurality of fine particles. That is, the metal fine particles can be a cluster formed with agglomerations of a plurality of fine particles. The agglomerations of the plurality of fine particles can express reinforced plasmon.

According to the present embodiment, the fine particles 116 and 117 are mixed with fluorescent particles in the red fluorescent layer 113 and the green fluorescent layer 114, respectively. The red fluorescent layer 113 and the green fluorescent layer 114 including the respective fine particles 116 and 117 and the respective fluorescent particles can reinforce fluorescence conversion. There are two reasons why fluorescence conversion is reinforced by the fine particles 116 and 117. One of the two reasons is reinforcement of an electric field that is generated in the vicinity of metal nano particles by surface plasmon excited in the metal nano particles by incident light. Molecules of fluorescent particles in the vicinity of the metal nano particles are more efficiently excited in the electric field thus reinforced. This effectively increases an absorbency of the incident light (excitation efficiency of the molecules) with an increase in emission intensity. An intensity of the reinforced electric field, and a region (distance) affected by the reinforced electric field remarkably depend on a size and a shape of the metal nano particles.

The other of the two reasons is an effect of increasing a quantum yield of emission light itself. The following describes quantitative explanation of the effect. Emission dipoles of excited molecules excite a vibration mode of free electrons of a metal, which free electrons express a surface plasmon and are adjacent to the emission dipoles (this means a shift of energy from the excited molecules to the metal), and luminous induction dipoles are provided to metal particles of the metal. A net emission efficiency of a system is proportional to square of a total dipole moment. It can be therefore expected that an emission efficiency (quantum yield) is increased as induction dipoles become larger in size than original dipoles of excited molecules.

It is preferable that the fine particles 116, 117, and 118 be in the vicinity of fluorescent particles. It is, for example, preferable that the fine particles 116, 117, and 118 be distant from the fluorescent particles by not more than several nanometers.

According to the present embodiment, the fine particles 116 and 117 are mixed with the fluorescent particles in the red fluorescent layer 113 and the green fluorescent layer 114, respectively. It should be noted that the present invention is not limited to this. For example, in a case where a light-emitting layer emits white light, a color filter, which serves as a color converting layer for converting white light into desired color of light, is employed, and the color filter can contain particles which express a surface plasmon phenomenon.

The fine particles 116 of the red fluorescent layer 113, the fine particles 117 of the green fluorescent layer 114, and the fine particles 118 of the transparent layer 115 can be different in particle size from one another. For example, the fine particles 116 of the red fluorescent layer 113, the fine particles 117 of the green fluorescent layer 114, and the fine particles 118 of the transparent layer 115 can be individually optimized in size. This makes it possible to more effectively increase a luminance of light having a predetermined wavelength.

According to the present embodiment, the fine particles 116, 117, and 118 are dispersed in the red fluorescent layer 113, the green fluorescent layer 114, and the transparent layer 115, respectively. It should be noted that the present invention is not limited to this. The organic EL element of the present invention can be configured such that particles that express a surface plasmon phenomenon are located on surfaces of the fluorescent layers and the transparent layer, which surfaces face the light-emitting layer. Alternatively, the organic EL element of the present invention can be configured such that a film of particles that express a surface plasmon phenomenon is formed on the surfaces of the fluorescent layers and the transparent layer, which surfaces face the light-emitting layer. Such configurations make it unnecessary to disperse metal fine particles in the fluorescent layers. It is therefore possible to produce a display element more easily.

(Other Components)

Other than the above-described components, a color filter can be provided between a substrate through which light is emitted outside and fluorescent layers. Conventional color filters can be employed as the color filter. The color filter can improve color purities of respective red, green and blue pixels. It is therefore possible to expand color reproduction regions of an organic EL display and an organic EL display device. Further, a red color filter provided on a red fluorescent layer, and a green color filter provided on a green fluorescent layer absorb blue components and ultraviolet components of external light. This can reduce or prevent emission of light from the fluorescent layers in response to the external light. It is therefore possible to reduce or prevent a decrease in contrast.

Further, a polarizing plate can be provided where light is emitted outside. An example of the polarizing plate is a combination of conventional linear polarizing plate and λ/4 plate. The polarizing plate can prevent an electrode of an organic EL display or an organic EL display device from reflecting external light, and can prevent a surface of a substrate or a sealing substrate from reflecting external light. It is therefore possible to improve contrast of the organic EL display and the organic EL display device.

The present embodiment has described a case where the light-emitting layer 109 is an organic electroluminescence light-emitting layer. It should be noted that the present invention is not limited to the case. For example, the light-emitting layer 109 can be a light emitting diode (LED) such as a blue light emitting diode. In a case where an LED is employed, it is possible to control shielding and transmission of emission light by use of liquid crystal.

(Display, and Display Device)

The present invention includes a display (such as an organic EL display) including a light-emitting element of the present invention, and a display device (such as an organic display device) including the display. It is therefore possible to produce a display and a display device each having a higher luminance, a wide viewing angle, and a high definition.

Figure 7:
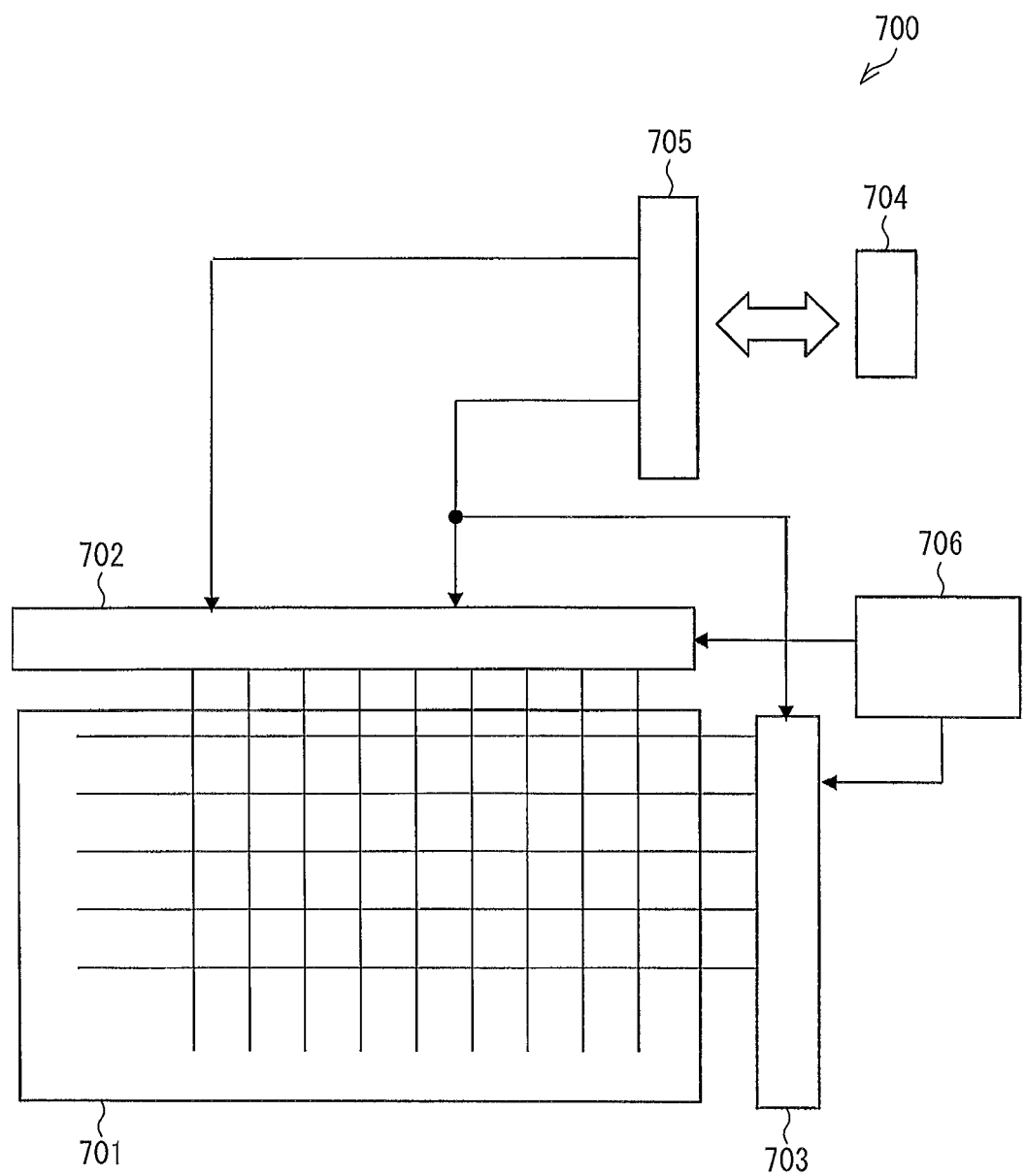
FIG. 7 is a view schematically illustrating a configuration of an organic EL display device in accordance with an embodiment of the present invention.

The following describes an example of a display device of the present invention with reference to FIG. 7. FIG. 7 is a view schematically illustrating a configuration of an organic EL display device 700 which is an embodiment of the display device of the present invention.

The organic EL display device 700 includes an organic EL panel 701, a video signal driving circuit 702, a scanning circuit 703, a CPU 704, a controller 705, and an organic EL power supply circuit 706.

The CPU 704 receives an image signal from, for example, a tuner (not shown). The CPU 704 creates, on the basis of the image signal, a signal indicating how to drive the video signal driving circuit 702 and the scanning circuit 703, and then supplies the signal to the controller 705. The controller 705 controls, according to the signal, the video signal driving circuit 702 and the scanning circuit 703 to drive. Specifically, the controller 705 controls the scanning circuit 703 to supply scanning signals to scanning lines of the organic EL panel 701, and controls the video signal driving circuit 702 to supply video signals to data lines of the organic EL panel 701. During supply of the scanning signals and the video signals, the organic EL power supply circuit 706 supplies a suitable voltage to the video signal driving circuit 702 and the scanning circuit 703.

Note that the display device of the present invention is not limited to the organic EL display device but can be, for example, a liquid crystal display device. In a case where the display device of the present invention is a liquid crystal display device, reference numeral 701 is a liquid crystal panel, and reference numeral 706 is a liquid crystal power supply circuit.

The light-emitting element of the present invention can be configured such that the light-emitting layer emits blue light, and the converting layer is a fluorescent layer for performing fluorescent conversion of the blue light.

The fluorescent layer can include a red fluorescent layer and a green fluorescent layer, the red fluorescent layer being configured to convert, into red, the blue light emitted from the light-emitting layer, and the green fluorescent layer being configured to convert, into green, the blue light emitted from the light-emitting layer.

According to the configuration, the light-emitting layer emits blue light, and the blue light is converted into red light and green light by the red fluorescent layer and the green fluorescent layer, respectively. An excitation efficiency and a quantum yield are improved by providing, in the vicinity of fluorescent materials, particles that express a plasmon phenomenon. This improves a conversion efficiency of fluorescence, thereby further increasing an emission intensity. It is consequently possible to emit light having a higher luminance.

It is desirable to configure the light-emitting element of the present invention such that a pair of electrode layers sandwich the light-emitting layer, one of the pair of electrode layers is the transparent electrode layer, and the pair of electrode layers and the light-emitting layer are structured to cause a micro cavity effect.

According to the configuration, a luminance and a color purity of emission light are remarkably improved by expression of the micro cavity effect.

The light-emitting element of the present invention can be configured to further include a transparent layer being transparent to the blue light without converting its color, the transparent layer containing the particles.

According to the configuration, it is possible to improve a luminance of the blue light that is transmitted by the transparent layer.

The light-emitting element of the present invention can be configured such that the particles contained in the red fluorescent layer and the particles contained in the green fluorescent layer are different in size from each other.

The light-emitting element of the present invention can be configured to further include a transparent layer being transparent to the blue light without converting its color. The light-emitting element of the present invention can be further configured such that the fluorescent layer includes a red fluorescent layer and a green fluorescent layer, the red fluorescent layer being configured to convert, into red, the blue light emitted from the light-emitting layer, and the green fluorescent layer being configured to convert, into green, the blue light emitted from the light-emitting layer, and the particles contained in the red fluorescent layer, the particles contained in the green fluorescent layer, and the particles contained in the transparent layer are different in size from each other.

According to the configuration, it is possible to further effectively increase a luminance of light having a predetermined wavelength by individually optimizing in size the particles contained in the red fluorescent layer, the particles contained in the green fluorescent layer, and the particles contained in the transparent layer.

The light-emitting element of the present invention can be configured such that (i) the particles contained in the fluorescent layer or in the transparent layer are mixed with fluorescent particles in the fluorescent layer or in the transparent layer, or the particles contained in the fluorescent layer are located on a surface of the fluorescent layer, which surface faces the light-emitting layer, and (ii) the particles contained in the transparent layer are located on a surface of the transparent layer, which surface faces the light-emitting layer. Alternatively, the light-emitting element of the present invention can be configured such that (i) the fluorescent layer includes a film of the particles contained in the fluorescent layer on a/the surface of the fluorescent layer, which surface faces the light-emitting layer, and (ii) the transparent layer includes a film of the particles contained in the transparent layer on a/the surface of the transparent layer, which surface faces the light-emitting layer.

All of the configurations make it possible to emit light having a high luminance.

The light-emitting element of the present invention can be configured such that the particles are made from metal.

The particles can be spherical, or can have two different-shaped cross sections being orthogonal with each other.

The particles can be agglomerations of a plurality of particles, or can be made from metal and a dielectric material.

All the configurations make it possible to emit light having a high luminance.

The light-emitting element of the present invention can be configured such that the light-emitting layer is an organic electroluminescence light-emitting layer.

According to the configuration, it is possible to obtain an organic electroluminescence element having a higher luminance and a wide viewing angle.

EXAMPLES

Example 1

The following describes an organic EL element 200 of Example 1. The organic EL element 200 of Example 1 was produced as follows.

(Production of Organic EL Element 200)

1. Production of Organic EL Section 1

First, an organic EL section 1 was produced.

(1. Selection of Substrate 11)

A glass substrate having a thickness of 0.7 mm was employed as a substrate 11 on which a TFT circuit is to be formed.

(2. Formation of Anode 12)

An anode 12 serving as a first electrode layer was formed on the substrate 11. A silver layer having a thickness of 100 nm, and an ITO (indium and tin) layer having a thickness of 20 nm were formed in this order on the substrate 11 by a sputtering method. The resultant was patterned by a photolithography method so as to be 90 stripes each having a width of 2 mm. A $SiO_2$ layer having a thickness of 200 nm was formed on the 90 stripes. Thereafter, an edge of the anode 12 was patterned by just 10 μm such that shorter sides of the stripes were covered with $SiO_2$. The patterned was washed with pure water by ultrasonic waves for 10 minutes, washed in acetone by ultrasonic waves for 10 minutes, washed with vapor by use of isopropyl alcohol for 5 minutes, and dried at 100° C. for one hour.

(3. Formation of Organic Layer 13)

The substrate 11 on which the anode 12 was formed was fixed to a substrate holder in an inline type resistive heating vapor deposition device. The inline type resistive heating vapor deposition device was reduced in pressure to become vacuum of not more than $1 \times 10^{-4}$ Pa. Consequently, an organic layer 13 was formed on the anode 12. According to Example 1, the organic layer 13 was a multilayer of a hole injecting layer, a hole transporting layer, an organic light-emitting layer, a hole preventing layer, an electron transporting layer, and an electron injecting layer.

First, a hole injecting layer, made from 1,1-bis-di-4-tolylamino-phenyl-cyclohexane (TAPC), was formed so as to have a thickness of 100 nm by a resistive heating vapor deposition method.

Secondly, a hole transporting layer, made from N,N'-di-1-naphthyl-N,N'-diphenyl-1,1'-biphenyl-1,1'-biphenyl-4,4'-diamine (NPD), was formed so as to have a thickness of 40 nm by a resistive heating vapor deposition method.

Thirdly, co-vapor deposition was carried out with 1,4-bis-triphenylsilyl-benzene (UGH-2) (a host material), and bis[(4,6-difluorophenyl)-pyridinato-N,C2']picolinate iridium (III) (FIrpic) (blue phosphorescent light emitting dopant) at respective vapor deposition rates of 1.5 Å/sec and 0.2 Å/sec, so that an organic light-emitting layer having a thickness of 30 nm was formed. The organic light-emitting layer of Example 1 was a blue light emitting layer.

Fourthly, a hole preventing layer, made from 2,9-dimethyl-4,7-diphenyl-1,10-phenanthroline (BCP), was formed so as to have a thickness of 10 nm.

Fifthly, an electron transporting layer, made from tris(8-hydroxyquinoline)aluminum (Alq3), was formed so as to have a thickness of 30 nm.

Lastly, an electron injecting layer, made from a lithium fluoride (LiF), was formed so as to have a thickness of 0.5 nm.

(4. Formation of Cathode 14)

A cathode 14 serving as a second electrode layer was formed on the organic layer 13.

First, the substrate 11 on which the anode 12 and the organic layer 13 were formed was fixed to a metal vapor deposition chamber.

Secondly, the organic layer 13 is covered with a cathode forming shadow mask having an opening via which a striped cathode 14 whose stripes each have a width of 2 mm is to be formed so as to be perpendicular to the stripes of the anode 12. Thereafter, co-vapor deposition was carried out with magnesium and silver at respective vapor deposition rates of 0.1 Å/sec and 0.9 Å/sec by a vacuum vapor deposition method, so that the cathode 14, with a desired pattern, was formed so as to have a thickness of 1 nm.

Thirdly, a silver layer was formed by means of vapor deposition at a vapor deposition rate of 1 Å/sec so as to have a thickness of 19 nm with a desired pattern. The silver layer can reinforce a micro cavity effect, and can prevent a voltage of the cathode 14 from being decreased by wiring resistance in the cathode 14.

The organic EL element of Example 1 is configured such that the anode 12 is a reflective electrode, and the cathode 14 is a semi-transparent electrode. Such a configuration makes it possible to (i) express a micro cavity effect between the anode 12 and the cathode 14, (ii) adjust a peak and a half band width of emission light to 460 nm and 50 nm, respectively, and (iii) improve front luminance. It is therefore possible to further efficiently transport emission energy from the light-emitting layer 13 to fluorescent layers.

Fourthly, an inorganic protective layer, made from $SiO_2$, was formed so as to have a thickness of 3 μm by a plasma CVD method. The inorganic protective layer was patterned, by use of a shadow mask, up to a sealing area which extends by 2 mm from each of four sides of a display section.

The organic EL section 1 was thus produced according to (1. Selection of Substrate 11), (2. Formation of Anode 12), (3. Formation of Organic Layer 13), and (4. Formation of Cathode 14).

2. Production of Fluorescent Section 2

(1. Selection of Substrate 15)

A glass substrate having a thickness of 0.7 mm was employed as a substrate 15. A red fluorescent layer 16, a green fluorescent layer 17, and a transparent layer 18 were formed on the substrate 15 so as to each have a width of 3 mm.

(2. Formation of Fluorescent Layers 16 and 17, and Transparent Layer 18)

A. Formation of Red Fluorescent Layer 16

First, 15 g of ethanol, and 0.22 g of γ-glycidoxypropyltriethoxysilane were added to 0.16 g of colloidal silicon dioxide having an average particle diameter of 5 nm, and stirred in an open system at room temperature for one hour.

Secondly, the resultant was transferred to a mortar. Thereafter, 20 g of red phosphor $K_5Eu_{2.5}(WO_4)6_{.25}$ was added to the mortar. The mixture was sufficiently ground, heated in an oven at 70° C. for two hours, and further heated in the oven at 120° C. for two hours. Consequently, $K_5Eu_{2.5}(WO_4)_{6.25}$ whose surface was modified was obtained.

Thereafter, 30 g of polyvinyl alcohol dissolved with 300 g of mixture solution in which water and dimethyl sulfoxide were mixed at a ratio of 1 to 1, was added to 10 g of the $K_5Eu_{2.5}(WO_4)_{6.25}$ whose surface was modified, and stirred by use of a dispersing device, so that a red phosphor forming solution was produced.

One milligram of gold particles 19 having mainly a particle size of 50 nm was added to the red phosphor forming solution, and uniformly dispersed.

The resultant red phosphor forming solution was applied onto a desired region of the glass substrate by a screen printing method so as to have a width of 3 mm. The glass substrate was then dried by heat in a vacuum oven (200° C., 10 mmHg) for four hours. Consequently, the red fluorescent layer 16 containing the gold particles 19 was formed.

B. Formation of Green Fluorescent Layer 17

First, 15 g of ethanol, and 0.22 g of γ-glycidoxypropyltriethoxysilane were added to 0.16 g of colloidal silicon dioxide having an average particle diameter of 5 nm, and stirred in an open system at room temperature for one hour.

Secondly, the resultant was transferred to a mortar. Thereafter, 20 g of green phosphor $Ba_2SiO_4:Eu^{2+}$ was added to the mortar. The mixture was sufficiently ground, heated in an oven at 70° C. for two hours, and further heated in the oven at 120° C. for two hours. Consequently, $Ba_2SiO_4:Eu^{2+}$ whose surface was modified was obtained.

Thereafter, 30 g of polyvinyl alcohol dissolved with 300 g of mixture solution in which water and dimethyl sulfoxide were mixed at a ratio of 1 to 1 was added to 10 g of the $Ba_2SiO_4:Eu^{2+}$ whose surface was modified, and stirred by use of a dispersing device, so that a green phosphor forming solution was produced.

One milligram of gold particles 20 having mainly a particle size of 20 nm was added to the green phosphor forming solution, and uniformly dispersed.

The resultant green phosphor forming solution was applied onto a desired region of the glass substrate by a screen printing method so as to have a width of 3 mm. The glass substrate was then dried by heat in a vacuum oven (200° C., 10 mmHg) for four hours. Consequently, the green fluorescent layer 17 containing the gold particles 20 was formed.

C. Formation of Blue Transparent Layer 18

Thirty gram of polyvinyl alcohol dissolved with 300 g of mixture solution in which water and dimethyl sulfoxide were mixed at a ratio of 1 to 1, was mixed with 1 mg of silver particles 21 having mainly a particle size of 2 nm, and stirred by use of a dispersing device, so that an adjustment layer forming solution was produced.

The adjustment layer forming solution was applied onto a desired region of the glass substrate by a screen printing method so as to have a width of 3 mm. The glass substrate was then dried by heat in a vacuum oven (200° C., 10 mmHg) for four hours. Consequently, the transparent layer 18 containing the silver particles 21 but no fluorescent material was formed.

The fluorescent section 2 was thus produced according to (1. Selection of Substrate 15) and (2. Formation of Fluorescent Layers 16 and 17, and Transparent Layer 18).

3. Assembly of Organic EL Element 200

The organic EL section 1 and the fluorescent section 2 were bonded to each other along a positioning marker provided outside the display section. Note that a thermosetting resin has been applied to the fluorescent substrate in advance, the substrate 11 and the fluorescent substrate were bonded to each other via the thermosetting resin, and the thermosetting resin was cured by heat of 90° C. for two hours. Note also that the substrate 11 and the fluorescent substrate were bonded to each other in a dry environment (moisture content: −80° C.) in order to prevent deterioration of an organic EL element caused by moisture.

Lastly, terminals formed in the periphery of the substrate 11 of the organic EL element 200 were connected to an external power supply, so that the organic EL element 200 was completed.

(Configuration of Organic EL Element 200)

Figure 2:
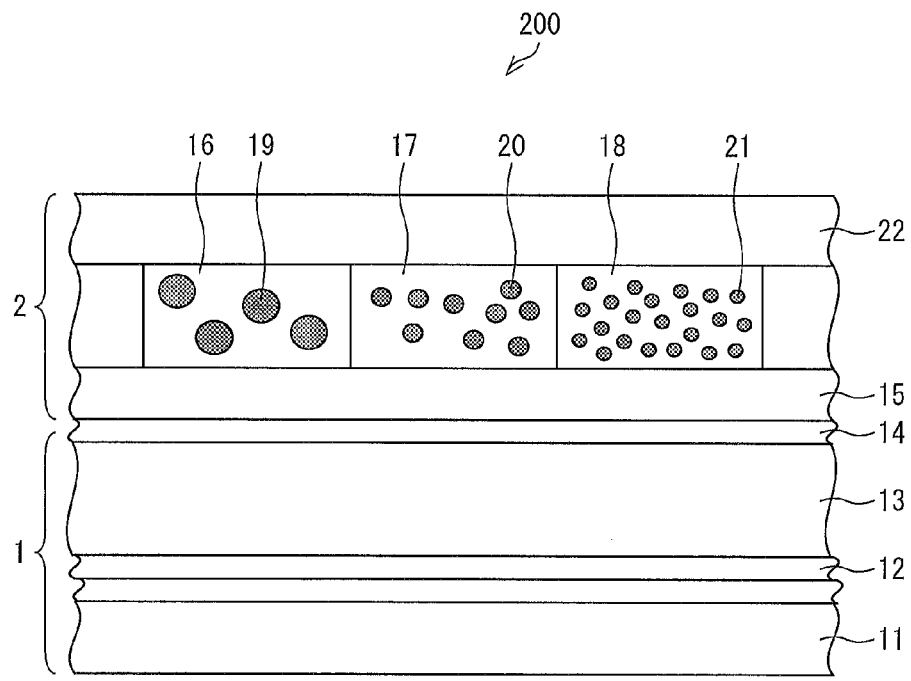
FIG. 2 is a cross-sectional view schematically illustrating an organic EL element of Example 1 of the present invention.

The following describes a configuration of the organic EL element 200 of Embodiment 1 with reference to FIG. 2. FIG. 2 is a partial cross-sectional view schematically illustrating the configuration of the organic EL element 200 of Example 1.

The organic EL element 200 was made up of the organic EL section 1 and the fluorescent section 2 bonded to each other. The organic EL section 1 includes the anode layer 12, the organic layer 13, the cathode layer 14, and the TFT substrate 11. The anode layer 12, the organic layer 13, and the cathode layer 14 were sequentially layered on the TFT substrate 11. The TFT substrate 11 was a glass substrate having a thickness of 0.7 mm. The anode layer 12 was a total reflection electrode, made from silver and ITO, which had a mirror surface. The organic layer 13 was a multilayer of a hole injecting layer, a hole transporting layer, an organic light-emitting layer, a hole preventing layer, an electron transporting layer, and an electron injecting layer. The organic light-emitting layer contained organic molecules for emitting blue light. The cathode layer 14 was a semi-transparent reflective electrode of magnesium and silver. The fluorescent section 2 includes the red fluorescent layer 16, the green fluorescent layer 17, and the transparent layer 18, each of which had a width of 3 mm. The red fluorescent layer 16, the green fluorescent layer 17, and the transparent layer 18 were formed on the substrate 15. A sealing substrate 22 was provided above in the fluorescent section 2. The substrate 15 was a glass substrate having a thickness of 0.7 mm. The gold particles 19 that were sphere with a particle size of 50 nm were uniformly mixed with red fluorescent particles in the red fluorescent layer 16. The gold particles 20 that were sphere with a particle size of 20 nm were uniformly mixed with green fluorescent particles in the green fluorescent layer 17. The gold particles 21 that were sphere with a particle size of 2 nm were uniformly dispersed in the transparent layer 18, but no fluorescent particles were contained in the transparent layer 18.

The organic layer 13 emitted blue light in response to a voltage applied to the anode layer 12 and the cathode layer 14. The blue light became blue light having a high luminance and a high color purity due to a micro cavity effect, and was then transported to the fluorescent section 2. The blue light was converted into red light and green light by fluorescent molecules mixed in the respective fluorescent layers. The metal particles 19, 20, and 21 express a surface plasmon effect, whereby light having a high luminance was emitted.

(Characteristic of Organic EL Element 200)

The organic EL element 200 (i) improved its luminance by approximately 5% through 10% as compared with a conventional organic EL display device whose fluorescent layer contained no metal particle, and (ii) attained a desired preferable image by applying a desired voltage to a desired striped electrode by an external power supply.

Example 2

The following describes an organic EL element 300 of Example 2. The organic EL element 300 of Example 2 was produced in the same manner as the organic EL element 200 of Example 1. Therefore, a process for producing the organic EL element 300 will not be described in Example 2.

(Configuration of Organic EL Element 300)

Figure 3:
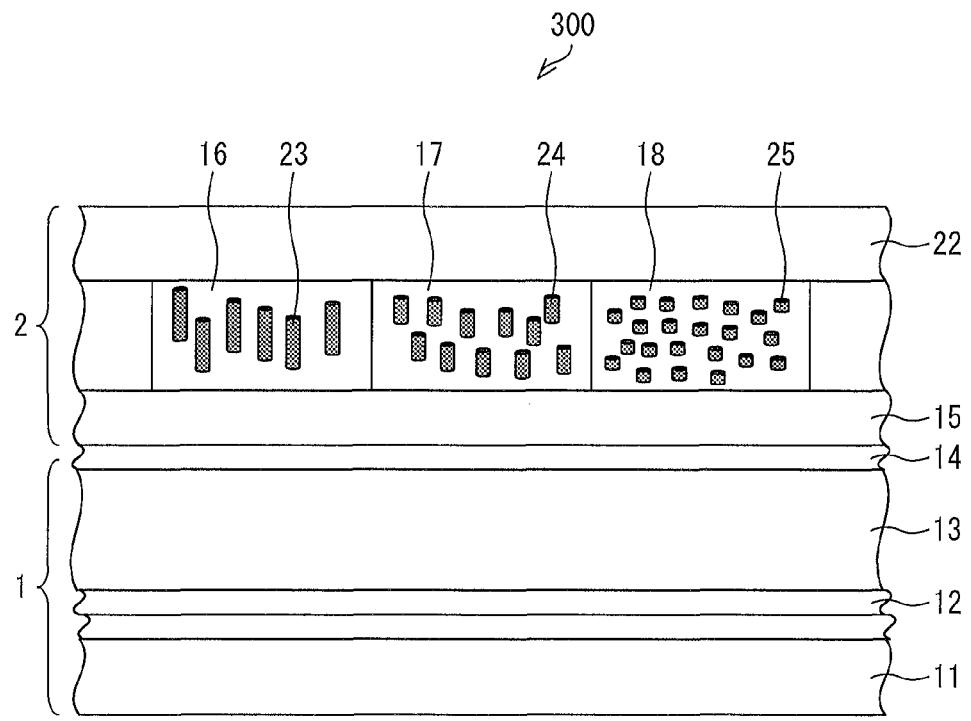
FIG. 3 is a cross-sectional view schematically illustrating an organic EL element of Example 2 of the present invention.

The following describes a configuration of the organic EL element 300 of Example 2 with reference to FIG. 3. FIG. 3 is a partial cross-sectional view schematically illustrating the configuration of the organic EL element 300 of Example 2.

The organic EL element 300 was made up of an organic EL section 1 and a fluorescent section 2 bonded to each other. The organic EL section 1 included an anode layer 12, an organic layer 13, a cathode layer 14, and a TFT substrate 11. The anode layer 12, the organic layer 13, and the cathode layer 14 were sequentially layered on the TFT substrate 11. The fluorescent section 2 included (i) a red fluorescent layer 16, (ii) a green fluorescent layer 17, and (iii) a transparent layer 18, each of which layers had a width of 3 mm, and (iv) a substrate 15. The red fluorescent layer 16, the green fluorescent layer 17, and the transparent layer 18 were formed on the substrate 15. A sealing substrate 22 was provided above in the fluorescent section 2. Configurations of members of the organic EL element 300 were identical to those of the organic EL element 200. Therefore, detailed descriptions of such members are omitted here, and merely differences from the organic EL element 200 will be described.

In the red fluorescent layer 16, columnar gold particles 23 that mainly had a diameter of 30 nm and a height of 50 nm were uniformly mixed with red fluorescent particles such that any adjacent ones of the columnar gold particles 23 were separated by approximately 30 nm from each other. In the green fluorescent layer 17, columnar silver particles 24 that mainly had a diameter of 15 nm and a height of 30 nm were uniformly mixed with green fluorescent particles such that any adjacent ones of the columnar silver particles 24 were separated by approximately 20 nm from each other. In the transparent layer 18, aluminum particles 25 that mainly had a diameter of 10 nm and a height of 5 nm were uniformly dispersed such that any adjacent ones of the aluminum particles 25 were separated by approximately 10 nm from each other, but no fluorescent particle was contained in the transparent layer 18.

(Characteristic of Organic EL Element 300)

The organic EL element 300 (i) improved its luminance by approximately 5% through 10% as compared with a conventional organic EL display device whose fluorescent layer contained no metal particle, and (ii) attained a desired preferable image by applying a desired voltage to a desired striped electrode by an external power supply.

Example 3

The following describes an organic EL element 400 of Example 3. The organic EL element 400 of Example 3 was produced in the same manner as the organic EL element 200 of Example 1. Therefore, a process for producing the organic EL element 400 will not be described in Example 3.

(Configuration of Organic EL Element 400)

Figure 4:
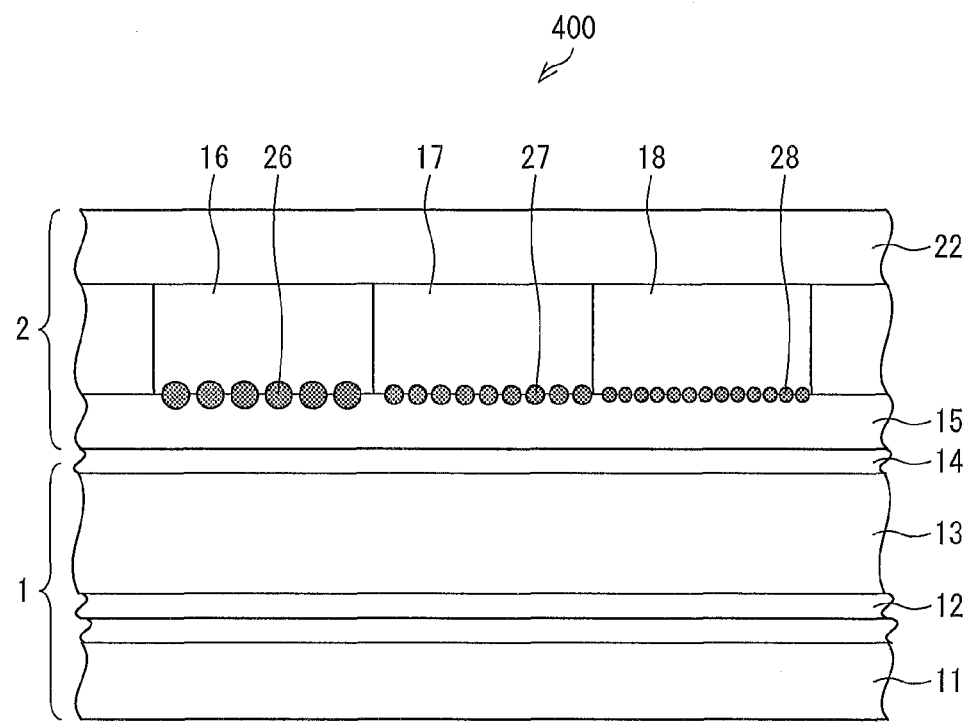
FIG. 4 is a cross-sectional view schematically illustrating an organic EL element of Example 3 of the present invention.

The following describes a configuration of the organic EL element 400 of Example 3 with reference to FIG. 4. FIG. 4 is a partial cross-sectional view schematically illustrating the configuration of the organic EL element 400 of Example 3.

The organic EL element 400 was made up of an organic EL section 1 and a fluorescent section 2 bonded to each other. The organic EL section 1 included an anode layer 12, an organic layer 13, a cathode layer 14 and a TFT substrate 11. The anode layer 12, the organic layer 13, and the cathode layer 14 were sequentially layered on the TFT substrate 11. The fluorescent section 2 included (i) a red fluorescent layer 16, (ii) a green fluorescent layer 17, and (iii) a transparent layer 18, each of which had a width of 3 mm, and (iv) a substrate 15. The red fluorescent layer 16, the green fluorescent layer 17, and the transparent layer 18 were formed on the substrate 15. A sealing substrate 22 was provided above in the fluorescent section 2. Configurations of members of the organic EL element 400 were identical to those of the organic EL element 200. Therefore, detailed descriptions of such members are omitted in Example 3, and merely differences from the organic EL element 200 will be described.

Columnar gold particles 26 that mainly had a size of 50 nm were uniformly aligned on a surface of the red fluorescent layer 16, which surface excitation light emitted from the organic layer enters, such that any adjacent ones of the columnar gold particles 26 were separated by approximately 30 nm from each other. Columnar silver particles 27 that mainly had a size of 20 nm were uniformly aligned on a surface of the green fluorescent layer 17, which surface excitation light emitted from the organic layer enters, such that any adjacent ones of the columnar silver particles 27 were separated by approximately 10 nm from each other. Aluminum particles 28 that mainly had a size of 2 nm were uniformly aligned on a surface of the transparent layer 18, which surface excitation light emitted from the organic layer enters, such that any adjacent ones of the aluminum particles 28 were separated by approximately 2 nm from each other, but no fluorescent particle was contained in the transparent layer 18.

(Characteristic of Organic EL Element 400)

The organic EL element 400 (i) improved its luminance by approximately 5% through 10% as compared with a conventional organic EL display device whose fluorescent layer contained no metal particle, and (ii) attained a desired preferable image by applying a desired voltage to a desired striped electrode by an external power supply.

Example 4

The following describes an organic EL element 500 of Example 4. The organic EL element 500 of Example 4 was produced in the same manner as the organic EL element 200 of Example 1. Therefore, a process for producing the organic EL element 500 will not be described in Example 4.

(Configuration of Organic EL Element 500)

Figure 5:
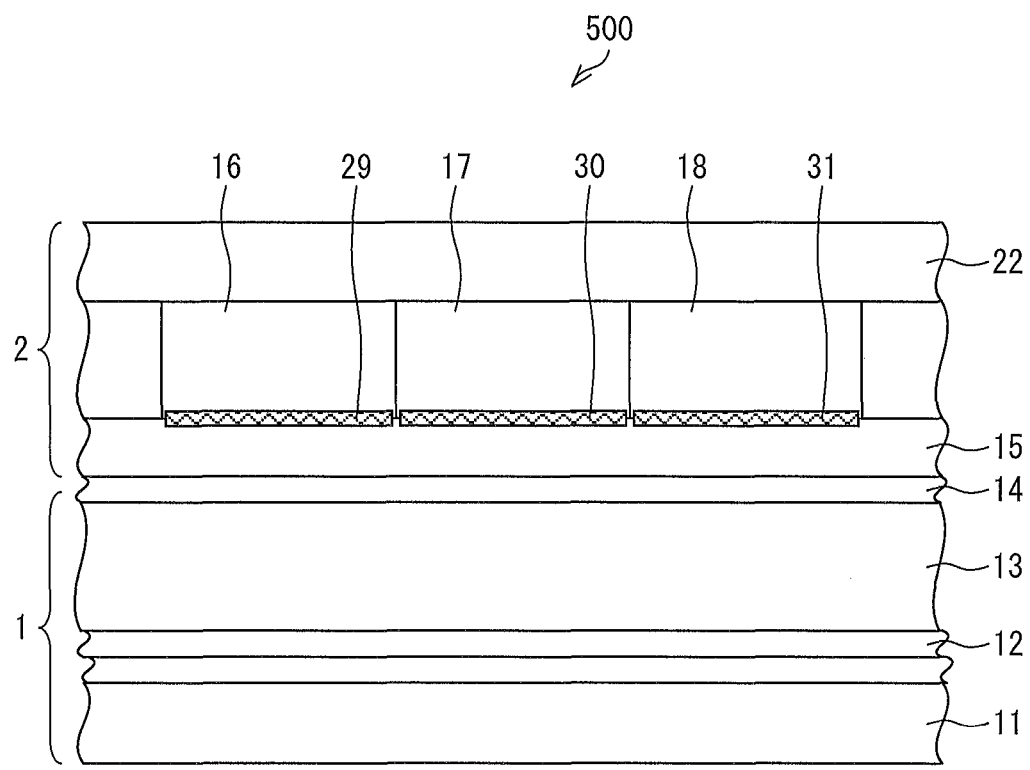
FIG. 5 is a cross-sectional view schematically illustrating an organic EL element of Example 4 of the present invention.

The following describes a configuration of the organic EL element 500 of Example 4 with reference to FIG. 5. FIG. 5 is a partial cross-sectional view schematically illustrating the configuration of the organic EL element 500 of Example 4.

The organic EL element 500 was made up of an organic EL section 1 and a fluorescent section 2 bonded to each other. The organic EL section 1 included an anode layer 12, an organic layer 13, a cathode layer 14, and a TFT substrate 11. The anode layer 12, the organic layer 13, and the cathode layer 14 were sequentially layered on the TFT substrate 11. The fluorescent section 2 included (i) a red fluorescent layer 16, (ii) a green fluorescent layer 17, and (iii) a transparent layer 18, each of which had a width of 3 mm, and (iv) a substrate 15. The red fluorescent layer 16, the green fluorescent layer 17, and the transparent layer 18 were formed on the substrate 15. A sealing substrate 22 was provided above in the fluorescent section 2. Configurations of members of the organic EL element 500 were identical to those of the organic EL element 200. Therefore, detailed descriptions of such members are omitted in Example 4, and merely differences from the organic EL element 200 will be described.

A gold thin film 29 having a thickness of approximately 30 nm was provided on a surface of the red fluorescent layer 16, which surface excitation light emitted from the organic layer enters. A silver thin film having a thickness of approximately 10 nm was provided on a surface of the green fluorescent layer 17, which surface excitation light emitted from the organic layer enters. An aluminum thin film 31 having a thickness of approximately 2 nm was provided on a surface of the transparent layer 18, which surface excitation light emitted from the organic layer enters.

(Characteristic of Organic EL Element 500)

The organic EL element 500 (i) improved its luminance by approximately 5% through 10% as compared with a conventional organic EL display device whose fluorescent layer contained no metal particle, and (ii) attained a desired preferable image by applying a desired voltage to a desired striped electrode by an external power supply.

Example 5

Configuration of Liquid Crystal Display Device 600

Figure 6:
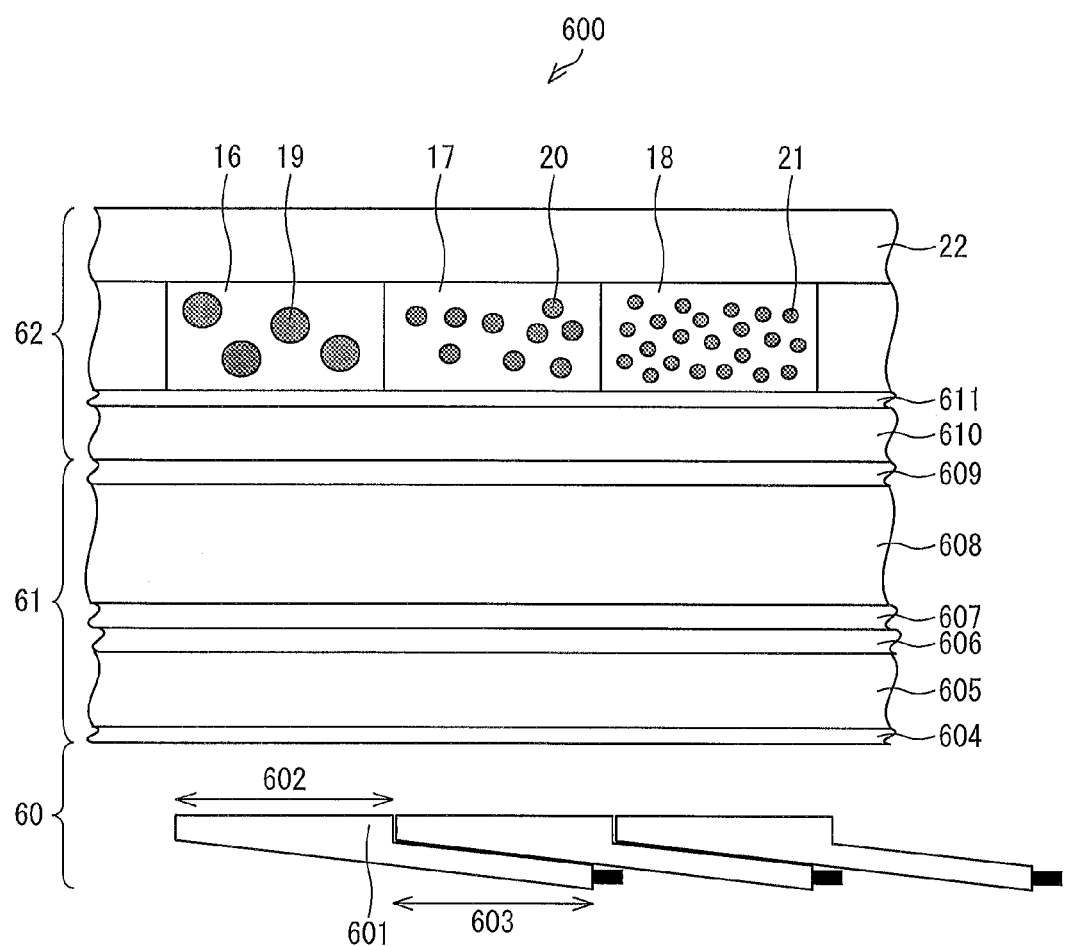
FIG. 6 is a cross-sectional view schematically illustrating a liquid crystal display element of Example 5 of the present invention.

The following describes a liquid crystal display element 600 of Example 5 with reference to FIG. 6. First, a configuration of the liquid crystal display element 600 of Example 5 will be described. FIG. 6 is a partial cross-sectional view schematically illustrating the configuration of the liquid crystal display element 600 of Example 5.

The liquid crystal display element 600 was made up of a backlight section 60, a liquid crystal section 61, and a fluorescent section 62.

The backlight section 60 was made up of blue light emitting diode elements 601 which were planarly arranged (see FIG. 6). A blue light emitting diode element 601 included a light emitting section 602 and a light guide section 603.

The liquid crystal section 61 included a polarizing plate 604, a TFT substrate 605, an electrode layer 606, an alignment film 607, a liquid crystal layer 608, and an alignment film 609 which were sequentially layered.

The fluorescent section 62 included a substrate 610, a red fluorescent layer 16, a green fluorescent layer 17, a transparent layer 18, and a sealing substrate 22. The red fluorescent layer 16, the green fluorescent layer 17, and the transparent layer 18 were formed on the substrate 610. The sealing substrate 22 was provided above in the fluorescent section 62. The red fluorescent layer 16, the green fluorescent layer 17, and the transparent layer 18 contained metal particles 19, 20 and 21, respectively. Configurations of members of the fluorescent section 62 were identical to those of the fluorescent section 2 of the organic EL element 200. Therefore, detailed descriptions of such members will be omitted in Example 5.

(Production of Liquid Crystal Display Element 600)

The following describes the liquid crystal section 61 in which how to produce the liquid crystal display element 600 is different from how to produce the organic EL element 200. The liquid crystal section 61 was produced as follows.

An unpolished glass substrate was employed as the TFT substrate 605. Scanning electrodes of aluminum were formed on the unpolished glass substrate. Each of the scanning electrodes had a surface covered with an alumina film that was an anode oxide film of aluminum. A gate insulating (gate SiN) film and an amorphous silicon (a-Si) film were formed so as to cover the scanning electrode. An n-type a-Si film, pixel electrodes, and signal electrodes were formed on the a-Si film. A striped common electrode was provided so as to be in the same layer as the pixel electrodes and the signal electrodes. Both the pixel electrodes and the signal electrodes were formed so as to be parallel to the striped common electrode, and so as to intersect with the scanning electrodes. In this manner, thin film transistors and a metal electrode group were formed on the TFT substrate. In the liquid crystal section thus configured, the pixel electrodes and the common electrode generated therebetween an electric field substantially parallel to an interface of the TFT substrate. Consequently, a so-called IPS (In-Plane Switching) liquid crystal element was produced.

All of the electrodes formed on the TFT substrate were made from aluminum. However, a material for the electrodes is not limited to aluminum. The electrodes can be made from metals having a low electric resistance, such as chrome and copper.

In Example 5, pixel number was 40(×3)×30, a lateral pixel pitch (a pixel pitch between stripes of the common electrode) was 80 μm, and a longitudinal pixel pitch (a pixel pitch between gate electrodes) was 240 μm. Each stripe of the common electrode had a width of 12 μm, and any adjacent ones of the stripes of the common electrode were separated by less than 68 μm from each other. This made it possible to keep a high aperture ratio.

The polarizing plate 604 was provided on the TFT substrate 605 on which the thin film transistors were formed. A polarizing plate 611 was provided on the substrate 610 facing the TFT substrate 605. A polarizing axis of the polarizing plate 604 was orthogonal to that of the polarizing plate 611.

Liquid crystal molecules were aligned in the vicinity of upper and lower interfaces of the liquid crystal layer 608 so as to have respective longitudinal directions substantially parallel to one another, and so as to make respective angles of 15° with an applied electric field direction. A liquid crystal cell was sealed with liquid crystal, with a positive dielectric anisotropy, which mainly included a compound having three fluoro groups at its end. The liquid crystal cell sealed with the liquid crystal was produced so as to have a cell gap of 38 μm. A G1220DU (manufactured by Nitto Denko Corporation) was employed as the polarizing plates 604 and 611. The two polarizing plates sandwiched the liquid crystal layer therebetween. One of polarizing transmission axes of the polarizing plates 604 and 611 was substantially parallel to a rubbing direction, and the other of the polarizing transmission axes was orthogonal to the rubbing direction. What is meant by "rubbing direction" is a longitudinal direction of liquid crystal molecules in the vicinity of the interfaces. The liquid crystal layer 608 thus configured had a normally closed property.

A driving LSI was connected to a panel thus produced, so that an active matrix driving element was produced.

(Characteristic of Liquid Crystal Display Element 600)

The liquid crystal display element 600 (i) improved its luminance by approximately 5% through 10% as compared with a conventional liquid crystal display device whose fluorescent layer contains no metal particle, and (ii) attained a desired preferable image by applying a desired voltage to a desired pixel electrode by an external power supply.

INDUSTRIAL APPLICABILITY

The present invention is suitably applicable to a display device, particularly to an organic EL display, and an organic EL display device.

REFERENCE SIGNS LIST

1: organic EL section
2: fluorescent section
11: substrate
12: anode (electrode layer)
13: organic layer (light-emitting layer)
14: cathode (electrode layer)
15: substrate
16: red fluorescent layer (converting layer)
17: green fluorescent layer (converting layer)
18: blue transparent layer (transparent layer)
19 through 28: metal particles (particles)
29 through 31: metal thin film (film of particles)
104: first electrode layer (electrode layer)
109: light-emitting layer
110: second electrode layer (electrode layer)
113: red fluorescent layer (converting layer)
114: green fluorescent layer (converting layer)
115: transparent layer
116: fine particles (particles)
117: fine particles (particles)
118: fine particles (particles)

The invention claimed is:

1. A light-emitting element, comprising:
a light-emitting layer;
a transparent electrode layer being transparent to at least part of light emitted from the light-emitting layer; and
a converting layer for converting color of the light, the converting layer and the light-emitting layer sandwiching the transparent electrode layer therebetween,
the converting layer containing particles that contains metal expressing a surface plasmon phenomenon.

2. The light-emitting element as set forth in claim 1, comprising:
a pair of electrode layers sandwiching the light-emitting layer,
one of the pair of electrode layers being a semi-transparent electrode layer provided as the transparent electrode layer,
the other one of the pair of electrode layers being a reflective electrode layer, and
the light-emitting layer having a thickness that matches a wavelength of the light emitted from the light-emitting layer.

3. The light-emitting element as set forth in claim 1, wherein the particles are made from the metal.

4. The light-emitting element as set forth in claim 1, wherein the particles are spherical.

5. The light-emitting element as set forth in claim 1, wherein the particles have two different-shaped cross sections being orthogonal with each other.

6. The light-emitting element as set forth in claim 1, wherein the particles are agglomerations of a plurality of particles.

7. The light-emitting element as set forth in claim 1, wherein the particles are made from the metal and a dielectric material.

8. The light-emitting element as set forth in claim 1, wherein the light-emitting layer is an organic electroluminescence light-emitting layer.

9. A display comprising a light-emitting element as set forth in claim 1.

10. A display device comprising a display as set forth in claim 9.

11. The light-emitting element as set forth in claim 1, wherein the light-emitting layer emits blue light, and the converting layer is a fluorescent layer for performing fluorescent conversion of the blue light.

12. The light-emitting element as set forth in claim 11, wherein the particles contained in the fluorescent layer are mixed with fluorescent particles in the fluorescent layer.

13. The light-emitting element as set forth in claim 11, wherein the particles contained in the fluorescent layer are located on a surface of the fluorescent layer, which surface faces the light emitting layer.

14. The light-emitting element as set forth in claim 11, wherein the fluorescent layer includes a film of the particles contained in the fluorescent layer on the surface of the fluorescent layer, which surface faces the light emitting layer.

15. The light-emitting element as set forth in claim 11, wherein the fluorescent layer includes a red fluorescent layer and a green fluorescent layer,
the red fluorescent layer being configured to convert, into red, the blue light emitted from the light-emitting layer, and
the green fluorescent layer being configured to convert, into green, the blue light emitted from the light-emitting layer.

16. The light-emitting element as set forth in claim 15, wherein the particles contained in the red fluorescent layer and the particles contained in the green fluorescent layer are different in size from each other.

17. The light-emitting element as set forth in claim 11, further comprising a transparent layer being transparent to the blue light without converting the blue light, the transparent layer containing the particles.

18. The light-emitting element as set forth in claim 17, wherein
the fluorescent layer includes a red fluorescent layer and a green fluorescent layer,
the red fluorescent layer is configured to convert, into red, the blue light emitted from the light-emitting layer,
the green fluorescent layer is configured to convert, into green, the blue light emitted from the light-emitting layer, and
the particles contained in the red fluorescent layer, the particles contained in the green fluorescent layer, and the particles contained in the transparent layer are different in size from each other.

19. The light-emitting element as set forth in claim 17, wherein the particles contained in the transparent layer are located on a surface of the transparent layer, which surface faces the light emitting layer.

20. The light-emitting element as set forth in claim 17, the transparent layer includes a film of the particles contained in the transparent layer on the surface of the transparent layer, which surface faces the light emitting layer.

* * * * *